United States Patent [19]

Mitani et al.

[11] Patent Number: 5,714,953
[45] Date of Patent: Feb. 3, 1998

[54] COMPOSITE DIGITAL-TO-ANALOG CONVERTER

[75] Inventors: Hiroshi Mitani, Yokohama; Nobutaka Kitagawa, Kawasaki, both of Japan

[73] Assignee: Kabushiki Kaisha Toshiba, Kawasaki, Japan

[21] Appl. No.: 703,183

[22] Filed: Aug. 26, 1996

[30] Foreign Application Priority Data

Aug. 28, 1995 [JP] Japan ................. 7-219019

[51] Int. Cl.$^6$ ................................... H03M 1/78
[52] U.S. Cl. ........................... 341/144; 341/154
[58] Field of Search .................... 341/144, 154, 341/153, 159

[56] References Cited

U.S. PATENT DOCUMENTS 5,225,837   7/1993   Hosotani et al. .................. 341/159

OTHER PUBLICATIONS

T. Higuchi et al., "Analog–digital conversion," Nikkan Kogyo Shimbun Ltd. (Jun. 1995), pp. 18–19.
I. Takahashi, "Compact electronic circuit handbook," Maruzen Co. Ltd. (Jan. 1989), pp. 203–204.

*Primary Examiner*—Brian K. Young
*Attorney, Agent, or Firm*—Finnegan, Henderson, Farabow, Garrett & Dunner, L.L.P.

[57] ABSTRACT

A digital-to-analog converter including first and second D/A converter circuit sections of R-2R ladder resistor type and a third D/A converter circuit section of string resistor type. The first D/A converter circuit section is supplied with a binary code of upper i bits of an n-bit ($i<n$) digital input and a first offset voltage having the weight of the least significant bit of the binary code and effecting the D/A conversion to output a first analog voltage to a first node. The second D/A converter circuit section is supplied with the binary code of upper i bits of and a second offset voltage having the weight of the least significant bit of the binary code and effecting the D/A conversion to output a second analog voltage which is different from the first analog voltage to a second node. The third D/A converter circuit section is connected between the first and second nodes and subjects a binary code of the remaining lower j bits ($j<n$, $j=n-i$, $i$, $j \geq 1$) of the digital input to the D/A conversion process to output an analog voltage corresponding to the n-bit digital input.

21 Claims, 15 Drawing Sheets

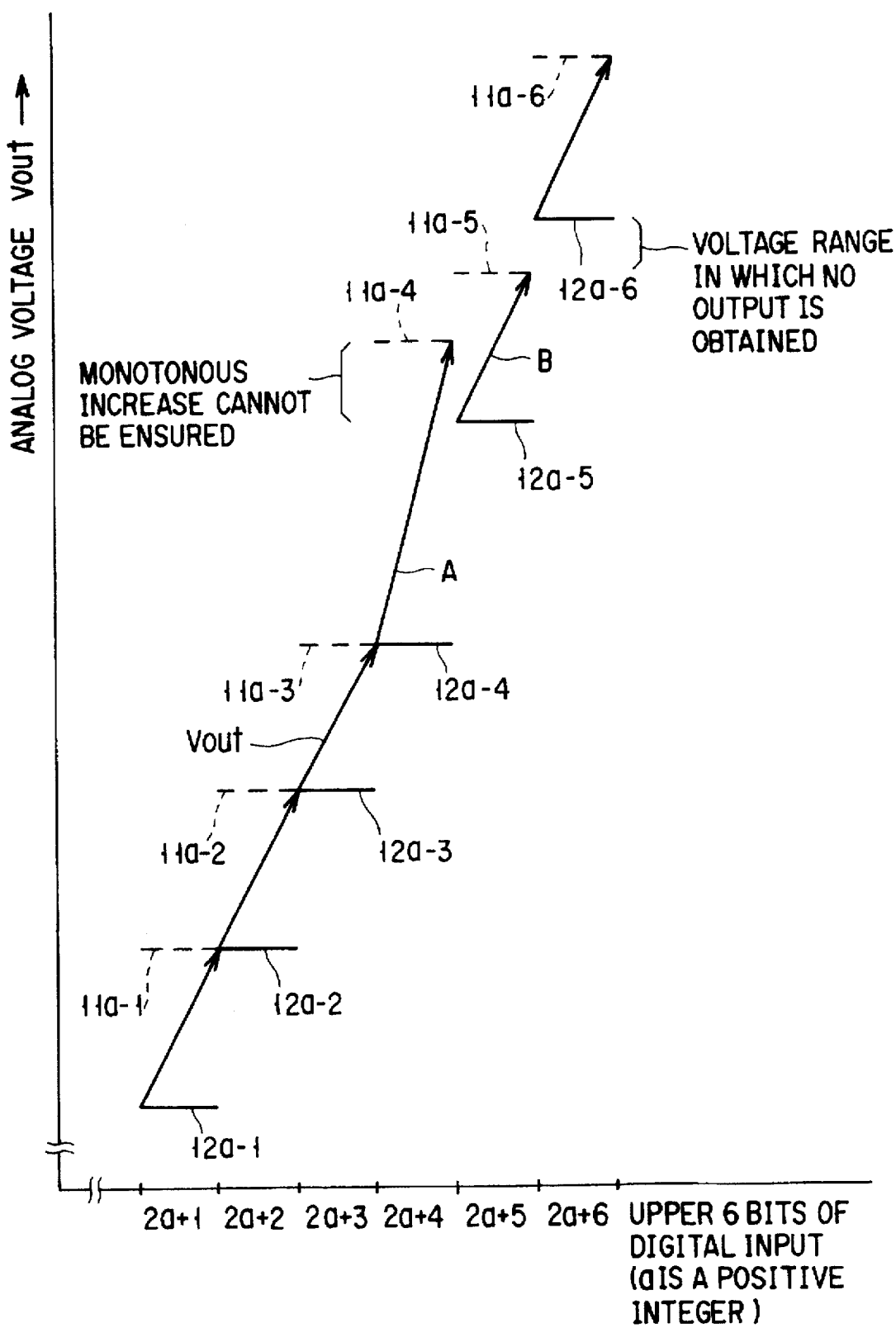
F I G. 7

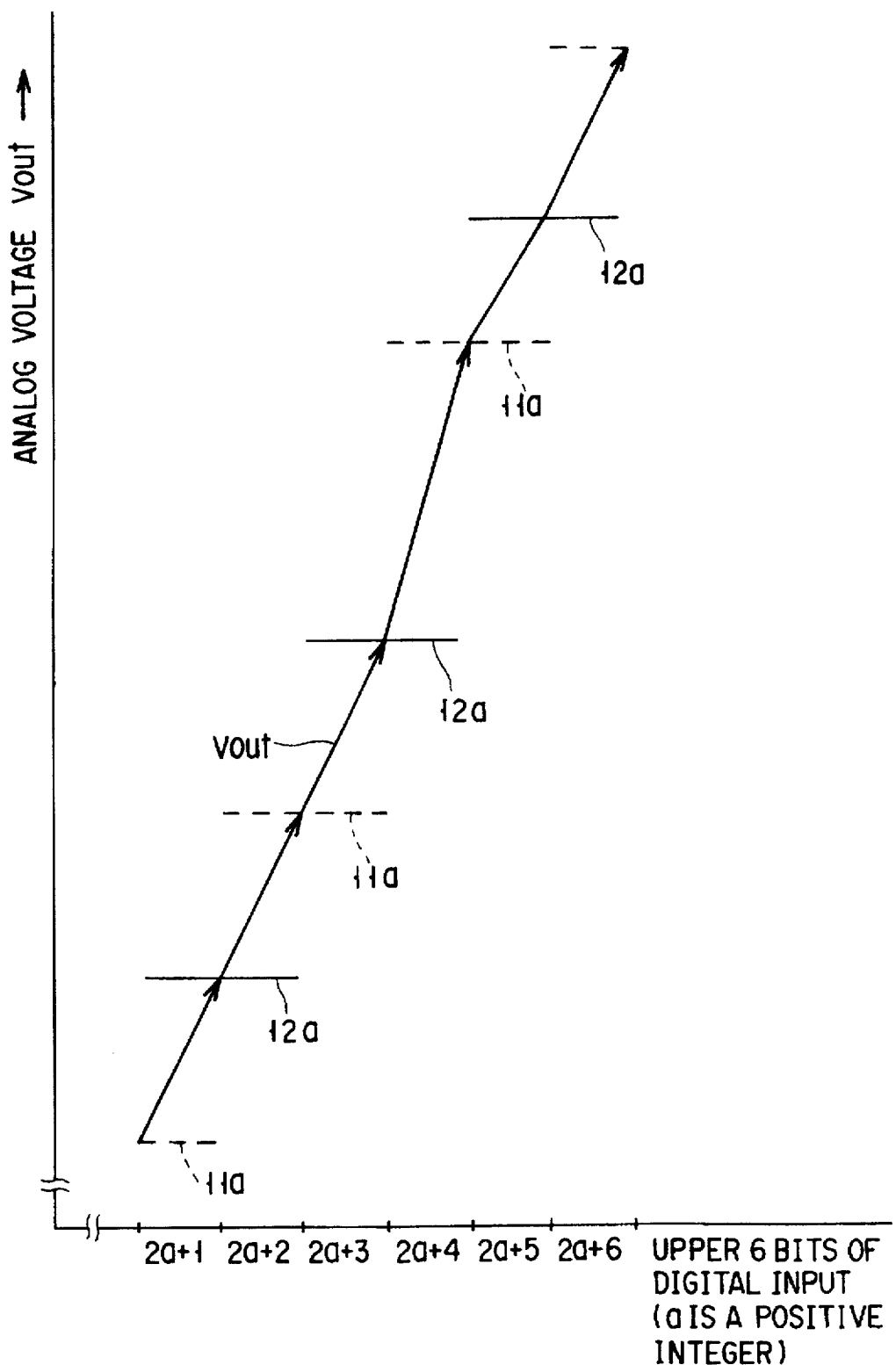
F I G. 10

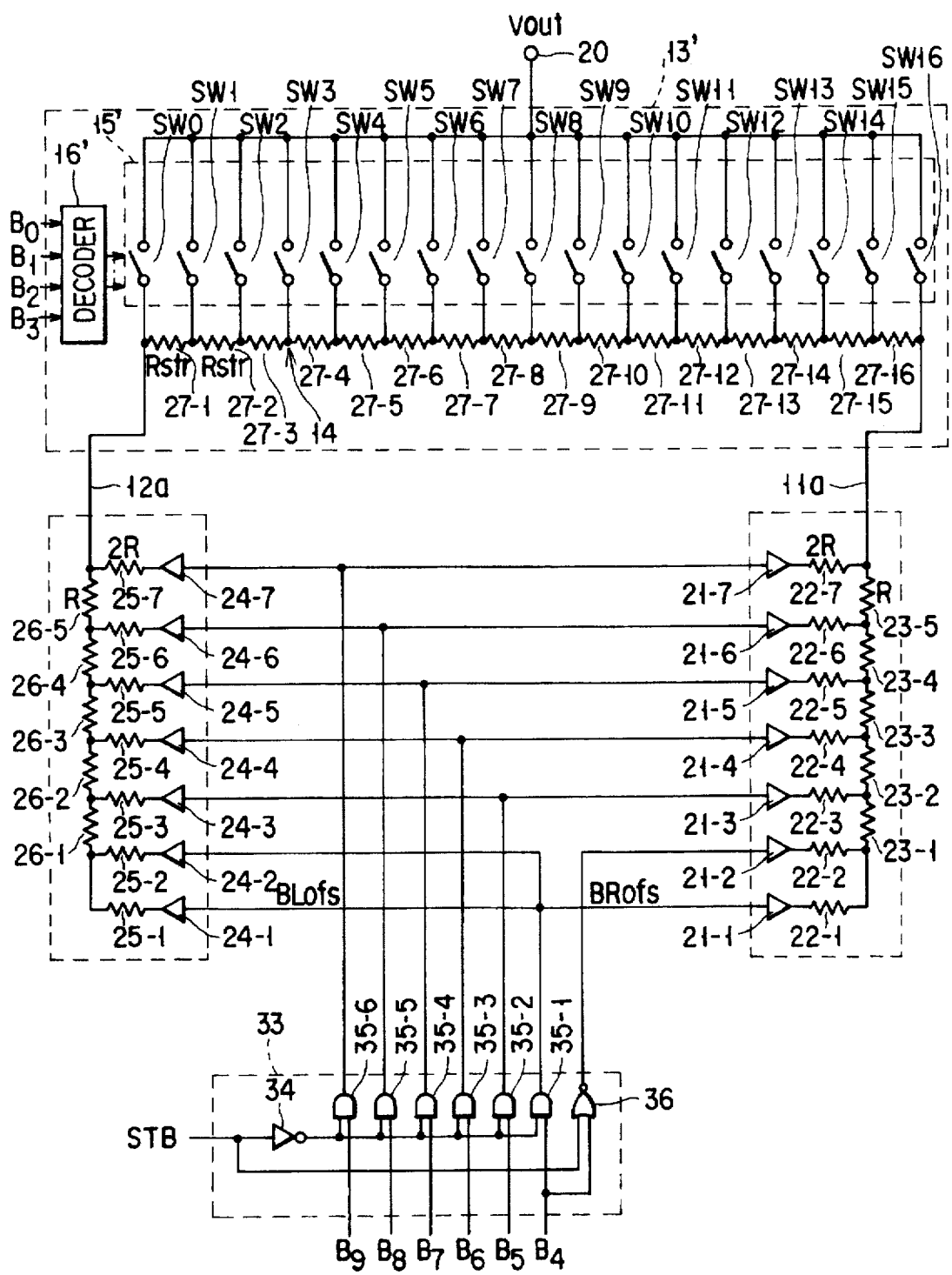
F I G. 11

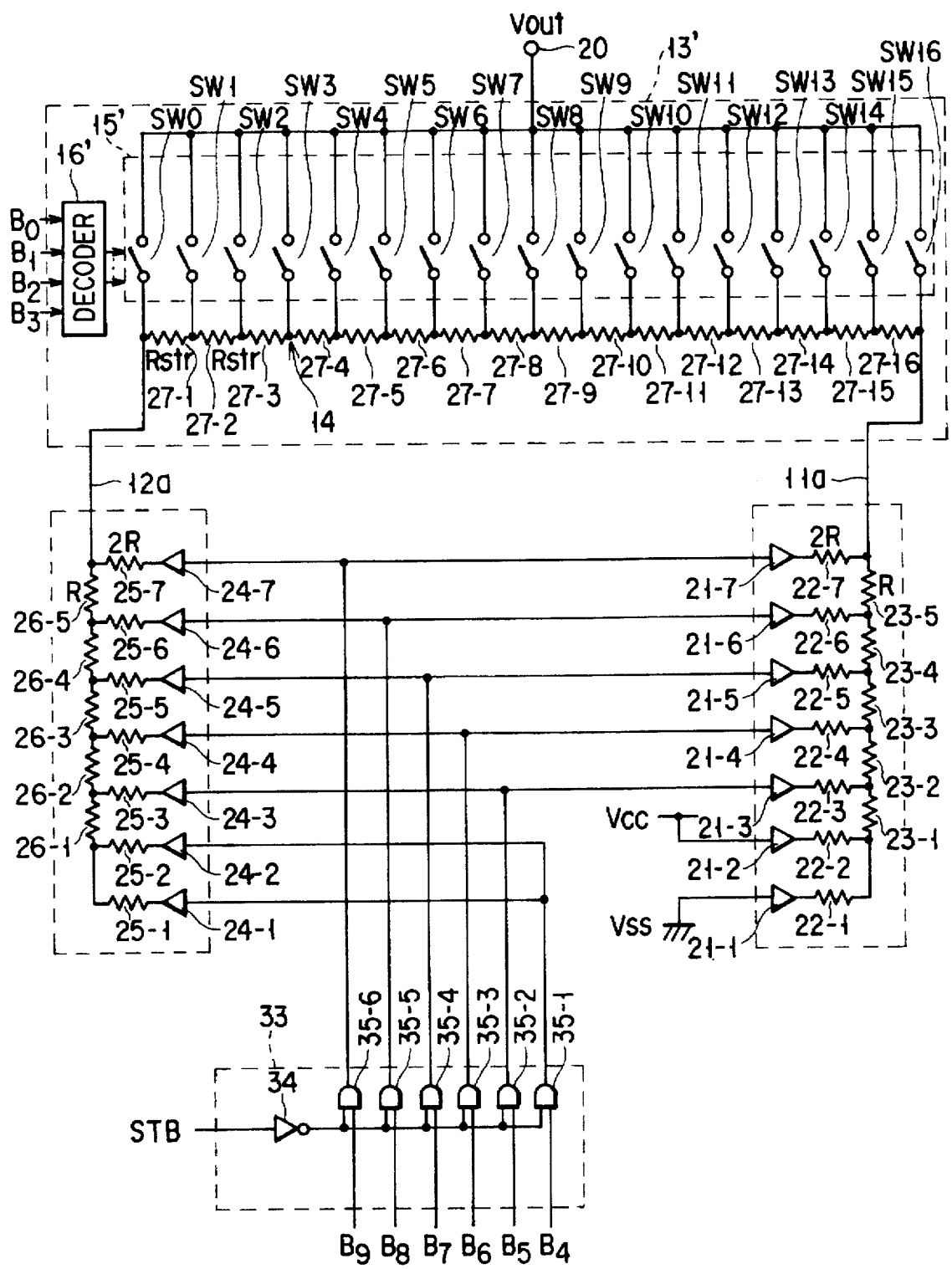
F I G. 12

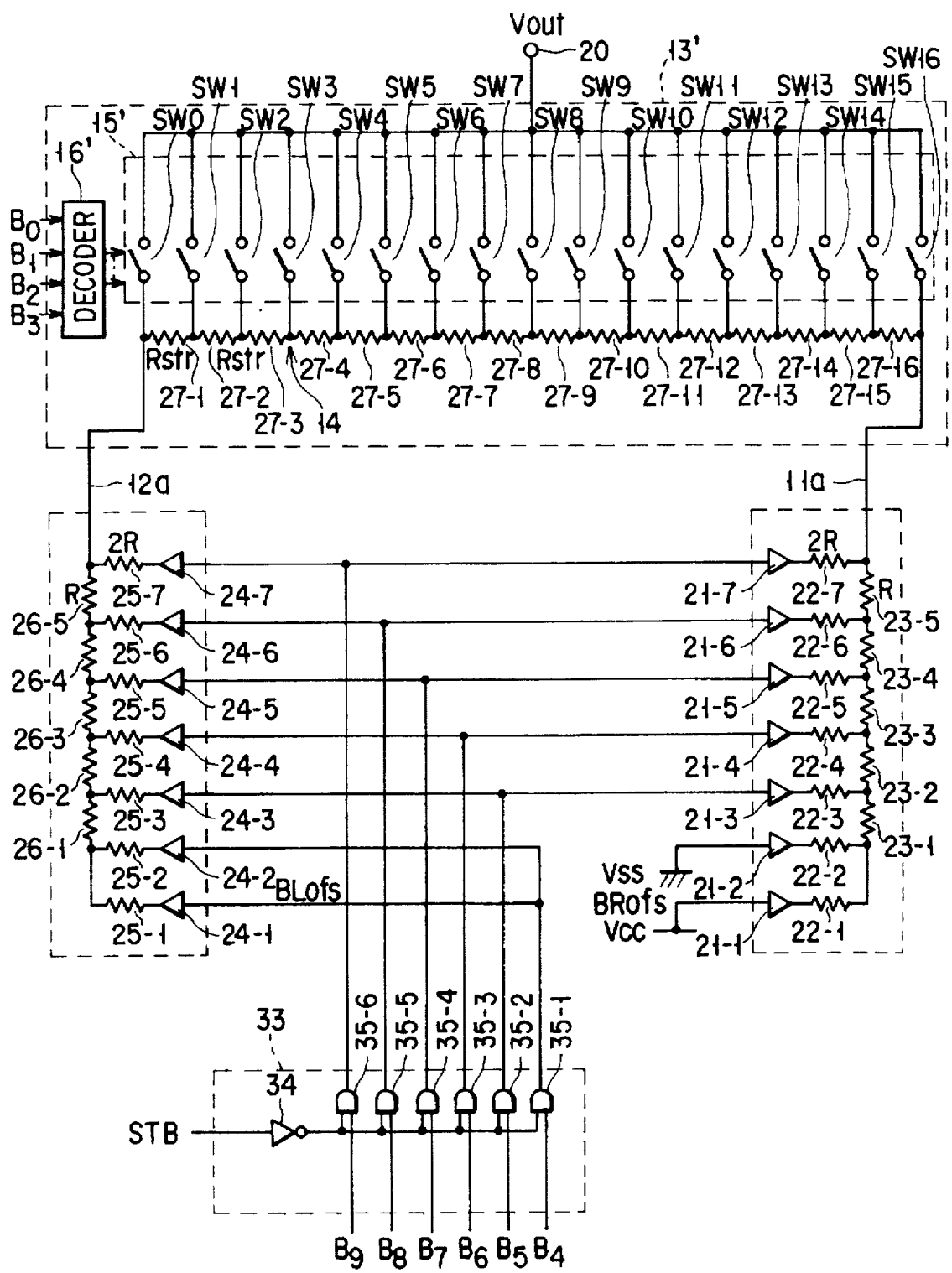
F I G. 13

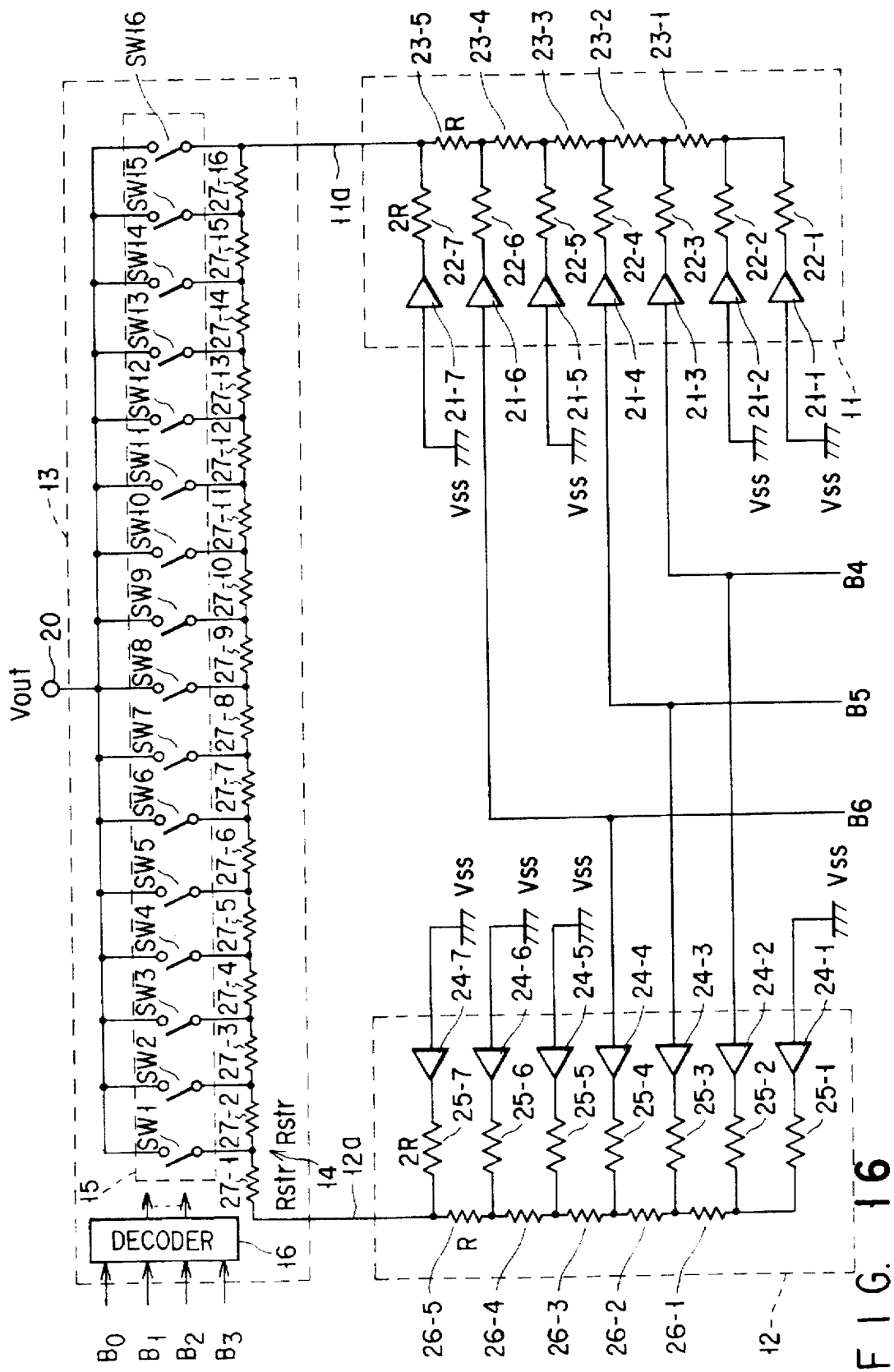
F I G. 16

COMPOSITE DIGITAL-TO-ANALOG CONVERTER

BACKGROUND OF THE INVENTION

1. Field of the Invention

This invention relates to an integrated digital-to-analog (D/A) converter, and more particularly to a composite D/A converter having a R-2R ladder resistor type D/A converter circuit section and a string resistor type D/A converter circuit section which is used in a one-chip controller or one-chip microcomputer of CMOS structure (which are hereinafter referred to as microcomputers), for example.

2. Description of the Related Art

Generally, in a microcomputer, there is provided a D/A converter for converting a digital signal into a corresponding analog signal after the digital signals are variously processed in the internal portion thereof. The D/A converter contained in the microcomputer is required to have high precision of conversion, small pattern area (for low cost), high noise resistance and the like. In addition, in recent years, it is strongly desired to develop a D/A converter of multi-bit structure in which the number of bits to be converted is large.

As the performance of the D/A converter, the resolution, absolute precision, and monotonously increasing property are the main important three factors. The resolution of the D/A converter indicates the number of bits of a binary code used for representing an analog voltage to be output and corresponds to the minimum unit of a variation in the analog voltage. The resolution becomes higher as the number of bits of the binary code of the digital input becomes larger. The absolute precision of the D/A converter indicates an error of the actual value of a converted output with respect to an ideal value. The absolute precision is lowered by a change in the environment of application (a variation in the ambient temperature, fluctuation in the power source voltage and the like) and fluctuation in the manufacturing process (variations in the resistances of the resistors formed in the D/A converter or the like). The absolute precision is expressed by the following equation (1) when $V_{REFL}$ is 0 and is expressed by the following equation (2) when $V_{REFL}$ is not 0 if an analog output voltage obtained when a value of a digital input is i is set to V(i), the lower limit of the analog voltage value is set to $V_{REFL}$, the upper limit of the analog output voltage is set to $V_{REFH}$, and the number of bits of the digital input is set to n.

$$V(i)=(V_{REFH}/2^n)\times i \quad (1)$$

$$V(i)=[V_{REFL}+\{(V_{REFH}-V_{REFL})/2^n\}\times i] \quad (2)$$

Further, the monotonously increasing property of the D/A converter is a characteristic of an output analog voltage to linearly increase according to a variation in the binary code when the binary code of the digital input is sequentially increased and indicates the capability or possibility of the relation between the analog output voltage V(i) obtained when a value of the digital input is i and the analog output voltage V(i+1) obtained when a value of the digital input is (i+1) to satisfy the following expression (3).

$$V(i) \leq V(i+1) \quad (3)$$

The most important factor among the three factors of the resolution, absolute precision and monotonously increasing property is determined according to the application of the D/A converter. For example, in a case where digital signals of multiple bits of RGB components used for display control are converted into corresponding analog signals which are in turn supplied to a color liquid crystal display driving circuit to display various colors on a color liquid crystal display device, the monotonously increasing property is the most important factor. This is because colors on the display image plane become gradually brighter when the values of the digital signals of the RGB components are gradually increased if the monotonously increasing property is excellent, but colors on the display image plane become temporarily dark if the monotonously increasing property is poor.

The D/A converters incorporated in the microcomputer need to have, in most cases, monotonously increasing property.

Conventionally, as the above-described D/A converter contained in the microcomputer, a R-2R ladder resistor type D/A converter and a string resistor type D/A converter are mainly used. The R-2R ladder resistor type D/A converter is described in the Nikkan Kogyo Shimbun Ltd., T. Higuchi et al., "Analog-digital conversion", June 1995, pp. 18 and 19, ISBN 4-526-03733-8, for example, and the string resistor type D/A converter is described in Maruzen Co., Ltd., I. Takahashi, "compact electronic circuit handbook", January 1989, pp. 203 and 204, ISBN 4-621-0331-x, for example.

Next, the R-2R ladder resistor type D/A converter and the string resistor type D/A converter are explained.

FIG. 1 shows an example of the construction of a 6-bit R-2R ladder resistor type D/A converter. An offset voltage and six bits $B_0$ to $B_5$ of a 6-bit binary code are respectively input to CMOS inverter circuits 80-1 to 80-7. The outputs of the CMOS inverter circuits 80-1 to 80-7 are respectively supplied to CMOS inverter circuits 81-1 to 81-7. The CMOS inverter circuits 81-1 to 81-7 are operated on the lower limit $V_{REFL}$ of the analog output voltage and the upper limit $V_{REFH}$ of the analog output voltage used as the power source voltages. Therefore, the "H" level of a signal output from each of the CMOS inverter circuits 81-1 to 81-7 is set to $V_{REFH}$ and the "L" level thereof is set to $V_{REFL}$. Outputs from the CMOS inverter circuits 81-1 to 81-7 are respectively supplied to one-side ends of resistors 82-1 to 82-7 each having a resistance of 2R. One end of a resistor 83-1 having a resistance of R is connected to the other ends of the resistors 82-1 and 82-2 and the other end thereof is connected to the other end of the resistor 82-3. A resistor 83-2 having a resistance of R is connected between the other end of the resistor 82-3 and the other end of the resistor 82-4. Likewise, resistors 83-3 to 83-5 each having a resistance of R are respectively connected between the other ends of the resistors 82-4 to 82-6 and the other ends of the resistors 82-5 to 82-7. An analog output voltage Vout is output from a connection node between the resistors 82-7 and 83-5.

Thus, the 6-bit R-2R ladder resistor type D/A converter is constructed by the CMOS inverter circuits 80-1 to 80-7, 81-1 to 81-7 and the resistors 82-1 to 82-7, 83-1 to 83-5. If the pattern areas of the CMOS inverter circuits 80-1 to 80-7, 81-1 to 81-7 are equal to each other and the pattern area of each of the resistors 82-1 to 82-7 having a resistance of 2R is twice the pattern area of each of the resistors 83-1 to 82-5 having a resistance of R, the CMOS inverter circuit has a pattern occupancy area corresponding to 14 CMOS inverter circuits and a pattern occupancy area corresponding to 19 resistors of resistance R. If the digital input is increased by one bit, the total pattern occupancy area of the D/A converter is increased by a pattern area corresponding to two CMOS inverter circuits and a pattern area corresponding to three resistors of resistance R. Therefore, if the number of bits of the binary code of the digital input is n and the number of bits of the offset voltage is 1, a pattern occupancy area corresponding to 2(n+1) CMOS inverter circuits and a pattern occupancy area corresponding to (n−1)+2(n+1)= 3n+1 resistors are required.

In order to maintain the preferable monotonously increasing property in the R-2R ladder resistor type D/A converter, it is necessary to strictly keep the ratio of the resistance of each of the resistors 83-1 to 83-5 to the resistance of each of the resistors 82-1 to 82-7 to 1:2. However, in practice, each of the resistors 83-1 to 83-5, 82-1 to 82-7 contains an error caused by a fluctuation in the manufacturing process. Further, on the resistors 82-1 to 82-7 side, since the ON-resistance of the MOS transistors in the CMOS inverter circuits 80-1 to 80-7, 81-1 to 81-7 are added to the resistances 2R, a variation in the ON-resistance also causes the error. The influence of the ON-resistance of the MOS transistor becomes stronger as the number of conversion bits becomes larger.

FIG. 2 shows the relation between the number n of bits of the binary code of the digital input and an error of the resistance 2R of the resistors 82-1 to 82-7 in a range in which the monotonously increasing property can be maintained in the R-2R ladder resistor type D/A converter. As is clearly seen from the diagram, it is necessary to reduce the relative errors of the resistances R and 2R as the number of bits of the binary code of the digital input becomes larger and, for example, when the number n of bits becomes approximately 10, the monotonously increasing property cannot be maintained if the relative errors of the resistances R and 2R are not set within a range of approx. 0.2% for each bit of the binary code of the digital input. Further, since the ON-resistance of the MOS transistor in the CMOS inverter circuit associated with the error of the resistance 2R varies according to the condition of application (ambient temperature, power source voltage and the like) of the microcomputer, it becomes more difficult to realize the multiple bit structure larger than 10 bits in the R-2R ladder resistor type D/A converter. If a plurality of MOS transistors having current paths connected in parallel are used as the load MOS transistors and drive MOS transistors of the CMOS inverter circuits 80-1 to 80-7, 81-1 to 81-7 in order to lower the ON-resistance of the MOS transistor causing the error, the influence by a variation in the ON-resistance can be suppressed. However, with the above construction, the pattern area of each of the CMOS inverter circuits 80-1 to 80-7, 81-1 to 81-7 becomes larger to increase the pattern occupancy area of the D/A converter.

FIG. 3 shows an example of the construction of a 10-bit string resistor type D/A converter. Binary code bits $B_0$ to $B_9$ of a 10-bit digital input and respective inversion signals $\overline{B_0}$ to $\overline{B_9}$ thereof are input to a decoder circuit 100. The decoder circuit 100 includes 10-input NAND gates 100-1 to 100-1024 and the NAND gates 100-1 to 100-1024 are selectively supplied with the binary code bits $B_0$ to $B_9$ and the inversion signals $\overline{B_0}$ to $\overline{B_9}$. For example, the NAND gate 100-1 is supplied with the binary code bits $B_0$ to $B_9$, the NAND gate 100-2 is supplied with the binary code bits $\overline{B_0}$, $B_1$ to $B_9$. Further, the NAND gate 100-1024 is supplied with the binary code bits $\overline{B_0}$ to $\overline{B_9}$. Output signals of the NAND gates 100-1 to 100-1024 are respectively supplied to CMOS inverter circuits 101-1 to 101-1024. 1024 resistors 103-1 to 103-1024 having a resistance of Rstr are serially connected between a first node to which an upper limit $V_{REFH}$ of an analog output voltage is applied and a second node to which a lower limit $V_{REFL}$ of the analog output voltage is applied so as to form a resistor string. One-side ends of transfer gates 102-1 to 102-1024 of CMOS structure are respectively connected to one-side ends of the resistors 103-1 to 103-1024 and the other ends thereof are connected together. The gates of the P-channel MOS transistors of the transfer gates 102-1 to 102-1024 are respectively connected to the output terminals of the NAND gates 100-1 to 100-1024, and the gates of the N-channel MOS transistors are respectively connected to the output terminals of the CMOS inverter circuits 101-1 to 101-1024. An analog voltage Vout is derived from the common connection node of the other ends of the transfer gates 102-1 to 102-1024.

The string resistor type D/A converter has a feature that the conversion precision is higher and the monotonously increasing property is excellent in comparison with the R-2R ladder type D/A converter.

Next, the pattern occupancy area of the string resistor type D/A converter is briefly explained. If the transfer gates 102-1 to 102-1024 have the same pattern areas as the CMOS inverter circuits 101-1 to 101-1024 and the NAND gates 100-1 to 100-1024 have the pattern areas which are ten times the pattern areas of the CMOS inverter circuits 101-1 to 101-1024, the 10-bit string resistor type D/A converter requires a pattern occupancy area of $(10+2) \times 2^{10} = 12288$ CMOS inverter circuits and a pattern occupancy area of $2^{10} = 1024$ resistors. In the case of the 11-bit string resistor type D/A converter, a pattern occupancy area of $(11+2) \times 2^{11} = 26624$ CMOS inverter circuits and a pattern occupancy area of $2^{11} = 2048$ resistors are required. Thus, each time the number of bits of the binary code of the digital input is increased by one, the pattern occupancy area of the CMOS inverter circuits and the pattern occupancy area of the resistors are doubled or more. Therefore, if the number of bits of the binary code of the digital input is n, a pattern occupancy area of $(n+2) \times 2^n$ CMOS inverter circuits and a pattern occupancy area of $2^n$ resistors having a resistance of Rstr are required.

Thus, in the string resistor type D/A converter, the number of components used is significantly increased if the number of bits of the digital input is large and the number of wirings is increased accordingly, and as a result, the pattern occupancy area is extremely enlarged. In addition, the conversion error increases with a variation in the resistance associated with the wirings.

As described above, in a D/A converter having a small number of conversion bits, both of the R-2R ladder resistor type and the string resistor type are effective. In the R-2R ladder resistor type D/A converter, the monotonously increasing property thereof is not so good as that of the string resistor type, but the pattern occupancy area is small and the rate of an increase in the pattern occupancy area with an increase in the number of conversion bits is small in comparison with the case of the string resistor type. On the other hand, in the string resistor type D/A converter, the pattern occupancy area thereof is larger than that of the R-2R ladder resistor type, but the monotonously increasing property is excellent and the conversion precision is high. However, if an attempt is made to construct a D/A converter having a large number of conversion bits, it is difficult to realize a high performance by use of either type and the pattern occupancy area is increased.

SUMMARY OF THE INVENTION

Accordingly, an object of this invention is to provide a composite D/A converter capable of effecting the D/A conversion with high precision in a relatively small pattern occupancy area even when the number of conversion bits is large.

5,714,953

The above object can be attained by a composite D/A converter comprising a first D/A converter circuit section of i-bit ladder resistor type for receiving a binary code of upper i bits of an n-bit (i<n) digital input and a first offset voltage of one bit having the weight of the least significant bit of the i-bit binary code and effecting the D/A conversion to output a first analog voltage to a first node; a second D/A converter circuit section of i-bit ladder resistor type for receiving the binary code of upper i bits of the n-bit digital input and a second offset voltage of one bit having the weight of the least significant bit of the i-bit binary code and effecting the D/A conversion to output a second analog voltage which is different from the first analog voltage to a second node; and a third D/A converter circuit section of j-bit (j<n, j=n−1) string resistor type connected between the first and second nodes of the first and second D/A converter circuit sections, for subjecting a binary code of the remaining lower j bits of the n-bit digital input to the D/A conversion process to output an analog voltage corresponding to the n-bit digital input.

With the above construction, since the first and second D/A converter circuit sections of ladder resistor type and the third D/A converter circuit section of the string resistor type are respectively constructed to have an i-bit input section and j-bit input section which are both smaller in the conversion bit number than the n-bit input section, a D/A converter which has a large conversion bit number and is difficult to be realized by use of a single D/A converter of ladder resistor type can be easily realized with high precision and the D/A conversion can be attained with a sufficiently small pattern area in comparison with a case wherein the D/A converter is constructed only by a single D/A converter of string resistor type.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a diagram showing the relation between the digital input and the analog output voltage Vout when the relation between the resistances of R-2R in the first and second D/A converter circuit sections in the circuit of FIG. 4 is changed;

FIG. 10 is a diagram showing the relation between a D/A conversion output and the magnitude of a voltage expressed by a binary code in the first and second D/A converter circuit sections in the circuit of FIG. 8;

FIGS. 11 to 13 are circuit diagrams showing composite D/A converters according to fourth to sixth embodiments of this invention;

FIG. 16 is a circuit diagram showing a composite D/A converter according to a ninth embodiment of this invention.

DETAILED DESCRIPTION OF THE PREFERRED EMBODIMENTS

Figure 4:
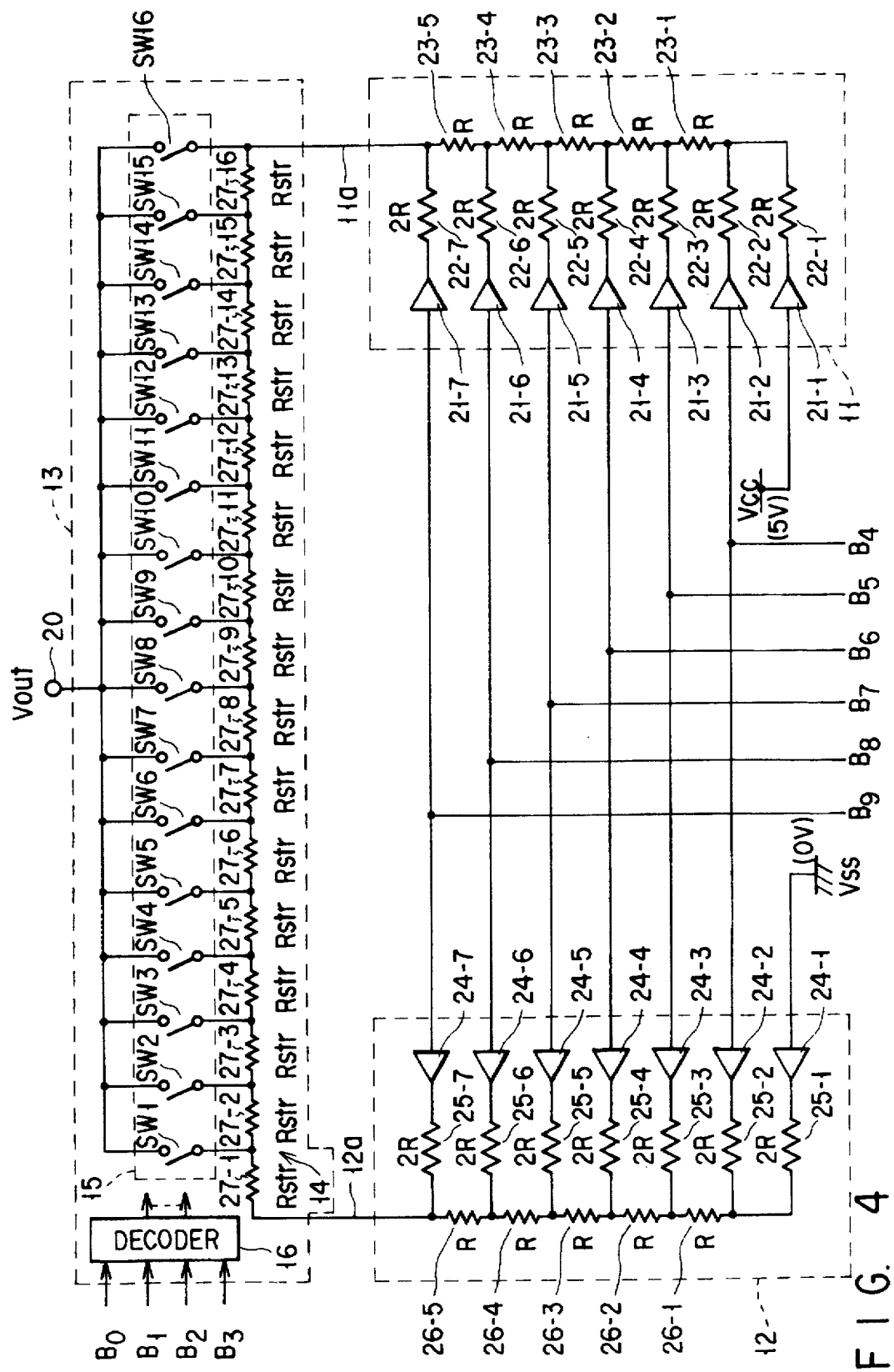
FIG. 4 is a circuit diagram showing a composite D/A converter according to a first embodiment of this invention.

FIG. 4 is a circuit diagram showing a composite D/A converter according to a first embodiment of this invention. The composite D/A converter is used for subjecting binary code bits $B_0$ to $B_9$ of an n-bit (in this example, n=10) digital input to the D/A conversion and includes a first D/A converter circuit section 11 of R-2R ladder resistor type, a second D/A converter circuit section 12 of R-2R ladder resistor type, and a D/A converter circuit section 13 of string resistor type connected between nodes 11a and 12a to which D/A conversion outputs of the D/A converter circuit sections 11 and 12 are supplied.

The D/A converter circuit section 11 includes buffer circuits 21-1 to 21-7, resistors 22-1 to 22-7 each having a resistance of 2R, and resistors 23-1 to 23-5 each having a resistance of R. A one-bit offset voltage and binary code bits $B_4$ to $B_9$ of upper i bits ($1 \leq i < n$, and in this example, i=6) of the binary code "$B_0$ to $B_9$" of the digital input are respectively input to the buffer circuits 21-1 to 21-7. The offset voltage exerts the same influence on the D/A conversion output as the "1" level of the least significant bit $B_4$ of the i-bit input (that is, it has the same weight as the "1" level of the least significant bit) and is fixed at the power source voltage Vcc (in this example, 5 V). Outputs of the buffer circuits 21-1 to 21-7 are respectively supplied to one-side ends of the resistors 22-1 to 22-7. One end of the resistor 23-1 is connected to the other ends of the resistors 22-1 and 22-2, and the other end thereof is connected to the other end of the resistor 22-3. One-side ends of the resistors 23-2 to 23-5 are respectively connected to the other ends of the resistors 22-3 to 22-6, and the other ends thereof are respectively connected to the other ends of the resistors 22-4 to 22-7. A first D/A conversion output is derived from a connection node between the resistors 22-7 and 23-5, that is, the first node 11a.

The D/A converter circuit section 12 includes buffer circuits 24-1 to 24-7, resistors 25-1 to 25-7 each having a resistance of 2R, and resistors 26-1 to 26-5 each having a resistance of R. A one-bit offset voltage and the binary code bits $B_4$ to $B_9$ of the digital input are respectively input to the buffer circuits 24-1 to 24-7. The offset voltage exerts the same influence on the D/A conversion output as the "0" level of the least significant bit $B_4$ of the i-bit input (that is, it has the same weight as the "0" level of the least significant bit) and is fixed at the ground potential Vss. Outputs of the buffer circuits 24-1 to 24-7 are respectively supplied to one-side ends of the resistors 25-1 to 25-7. One end of the resistor 26-1 is connected to the other ends of the resistors 25-1 and 25-2, and the other end thereof is connected to the other end of the resistor 25-3. One-side ends of the resistors 26-2 to 26-5 are respectively connected to the other ends of the resistors 25-3 to 25-6, and the other ends thereof are respectively connected to the other ends of the resistors 25-4 to 25-7. A second D/A conversion output is derived from a connection node between the resistors 25-7 and 26-5, that is, the second node 12a.

With the above construction, the voltage levels of the D/A conversion outputs from the first node 11a and second node 12a are determined according to the i bits $B_4$ to $B_9$, the D/A conversion output from the first node 11a is always kept higher than the D/A conversion output from the second node 12a, and the potential difference therebetween is set to a value corresponding to the weight of the least significant bit $B_4$ of the i-bit input. That is, a potential difference which corresponds to one of potential levels determined by equally dividing the potential difference between Vcc and Vss of the offset voltages by $2^i=2^6$ and which is specified according to the i-bit binary code "$B_4$ to $B_9$" occurs between the first node 11a and the second node 12a.

The third D/A converter circuit section 13 has a function of subjecting a binary code "$B_0$ to $B_3$" of the remaining lower j ($1 \leq j < n$, $1 \leq i < n$, j=n−i, and in this example, n=10, i=6, j=4) bits in the binary code "$B_0$ to $B_9$" of the digital input to the D/A conversion process. The third D/A converter circuit section 13 includes a resistor string 14, selection circuit 15 and decoder circuit 16. The resistor string 14 is constructed by $2^j$ (which is 16 in this example) resistors 27-1 to 27-16 with a resistance of Rstr serially connected between the first node 11a and the second node 12a. Voltages sequentially increasing step by step in a direction from the second node 12a to the first node 11a are created on the ($2^j-1$) voltage dividing nodes of the resistor string 14. As the resistor string 14, a resistor string constructed by a series circuit of ($2^j-1$) resistors with a resistance of Rstr and two resistors with a resistance of Rstr/2 connected to the respective ends of the above series circuit can be used. The selection circuit 15 is used to selectively derive voltages on the second node 12a, the voltage dividing nodes of the resistor string 14 and the first node 11a (in this example, a case wherein voltages on the voltage dividing nodes of the resistor string 14 and the first node 11a are selectively derived is shown) and includes $2^j$ switching circuits SW1 to SW16 which have one-side ends respectively connected to the above nodes and have the other ends commonly connected to an output terminal 20. The ON/OFF states of the switching circuits SW1 to SW16 are selectively controlled by signals obtained by decoding the j-bit binary code "$B_0$ to $B_3$" in the decoder circuit 16. That is, a voltage which is one of the voltages obtained by equally dividing the potential difference between the first and second nodes 11a and 12a whose voltage levels are determined according to the i-bit binary code "$B_4$ to $B_9$" and the offset voltages by $2^j$ according to the j-bit binary code "$B_0$ to $B_3$" and which is a voltage on one of the nodes corresponding to the j-bit binary code is selected and output from the output terminal 20. As a result, an analog voltage Vout which is one of the voltages determined by equally dividing the potential difference between the offset inputs (between the power source voltage Vcc=5 V and the ground potential Vss=0 V) supplied to the D/A converter circuit sections 11 and 12 by $2^n$ and which is a voltage corresponding to the binary code "$B_0$ to $B_9$" of the n-bit digital input is output.

Figures 5A, 5B:
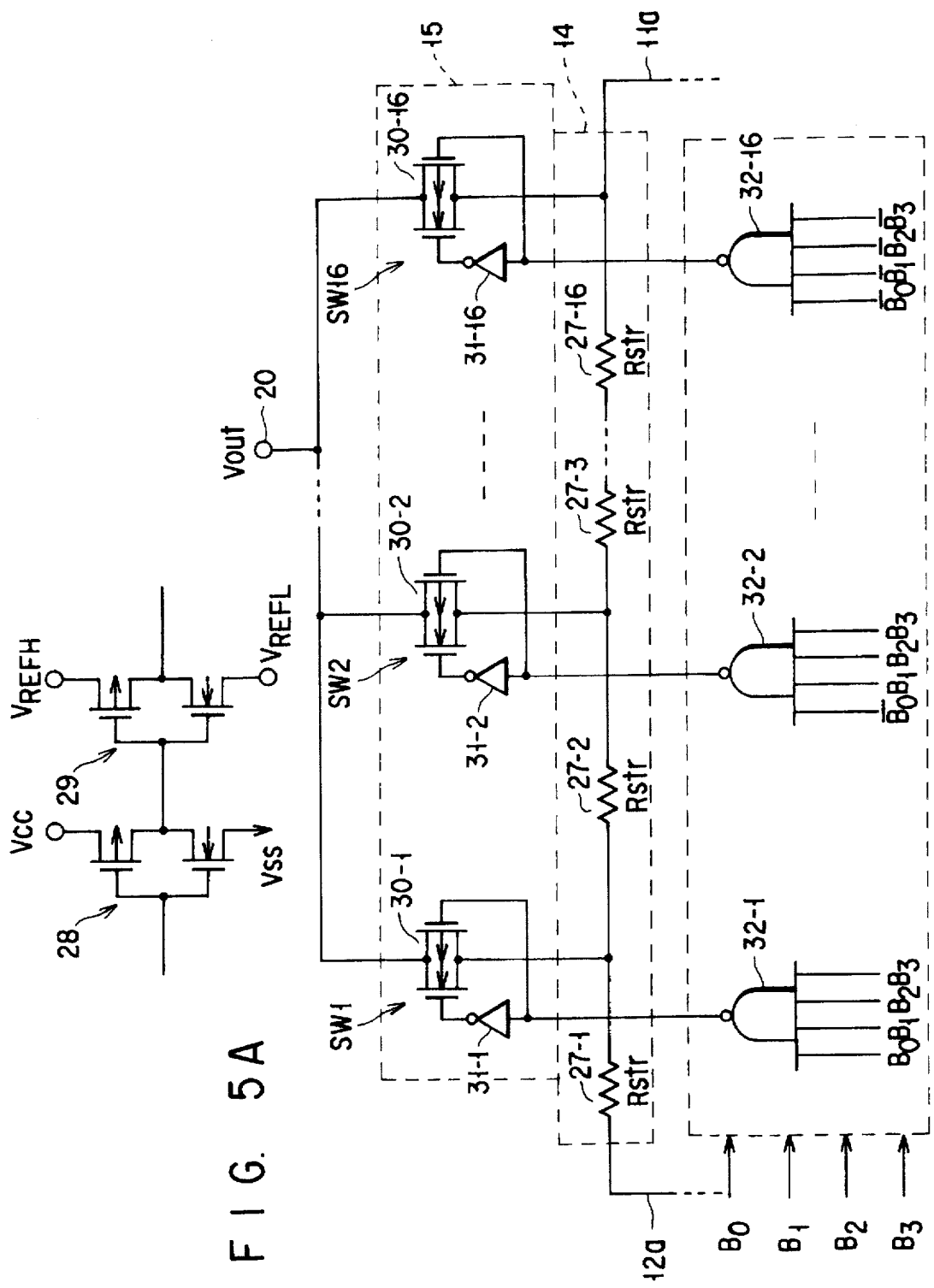
FIG. 5A is a circuit diagram showing an example of the construction of a buffer circuit in first and second D/A converter sections of R-2R ladder resistor type in the composite D/A converter shown in FIG. 4.
FIG. 5B is a circuit diagram showing an example of the construction of a third D/A converter circuit section of string resistor type in the composite D/A converter shown in FIG. 4.

FIG. 5A shows an example of the construction of the buffer circuits 21-1 to 21-7, 24-1 to 24-7 in the first and second D/A converter circuit sections 11, 12 in the D/A converter shown in FIG. 4. Each of the buffer circuits includes a first CMOS inverter circuit 28 which receives a binary code bit at the input terminal thereof and a second CMOS inverter circuit 29 whose input terminal is connected to the output terminal of the first CMOS inverter circuit 28 and whose output terminal is connected to one end of the resistor with the resistance of 2R. The first CMOS inverter circuit 28 is operated on the power source voltage Vcc and the ground potential Vss and the second CMOS inverter circuit 29 is operated on a voltage between the upper limit $V_{REFH}$ and the lower limit $V_{REFL}$ of the analog output voltage of the node 11a or 12a in the D/A converter circuit section 11 or 12 as a power source voltage.

FIG. 5B shows an example of the construction of the D/A converter circuit section 13 in the D/A converter shown in FIG. 4. The switches SW1 to SW16 of the switching circuit 15 are respectively constructed by transfer gates 30-1 to 30-16 of CMOS structure and CMOS inverter circuits 31-1 to 31-16. One-side ends of the transfer gates 30-1 to 30-16 are connected to the respective voltage dividing nodes of the resistor string 14, that is, to the one-side ends of the respective resistors 27-1 to 27-16 and the other ends thereof are commonly connected to the output terminal 20. The gate of a P-channel MOS transistor in each of the transfer gates 30-1 to 30-16 is connected to the input terminal of a corresponding one of the CMOS inverter circuits 31-1 to 31-16 and the gate of an N-channel MOS transistor thereof is connected to the output terminal of a corresponding one of the CMOS inverter circuits 31-1 to 31-16.

The decoder circuit 16 includes a CMOS inverter circuit (not shown) for creating inversion signals $\overline{B_0}$ to $\overline{B_3}$ of the input binary code bits $B_0$ to $B_3$ and 4-input NAND gates 32-1 to 32-16. The NAND gates 32-1 to 32-16 are selectively supplied with the binary code bits $B_0$ to $B_3$ and the inversion signals $\overline{B_0}$ to $\overline{B_3}$. For example, the NAND gate 32-1 is supplied with binary code bits $B_0$ to $B_3$, and the NAND gate 32-2 is supplied with binary code bits $\overline{B_0}$, $B_1$ to $B_3$. Further, the NAND gate 32-16 is supplied with binary code bits $\overline{B_0}$ to $\overline{B_3}$. Output signals of the NAND gates 32-1 to 32-16 are respectively supplied to the input terminals of the CMOS inverter circuits 31-1 to 31-16.

The D/A converter of the first embodiment effects the n-bit D/A conversion by use of the R-2R ladder resistor type D/A converter circuit sections 11, 12 for D/A conversion of the upper i bits of the n-bit binary code and the string resistor type D/A converter circuit section 13 for D/A conversion of the lower j bits. Thus, since the R-2R ladder resistor type D/A converter circuit sections 11, 12 and the string resistor type D/A converter circuit section 13 are respectively constructed to have an i-bit input section and j-bit input section which are both smaller in the conversion bit number than the n-bit input section, a D/A converter which has a large conversion bit number and is difficult to be realized by use of a single D/A converter of R-2R ladder resistor type can be easily realized with high precision and the D/A conversion can be attained with a sufficiently small pattern area in comparison with a case wherein the D/A converter is constructed only by a single D/A converter of string resistor type.

Figure 1:
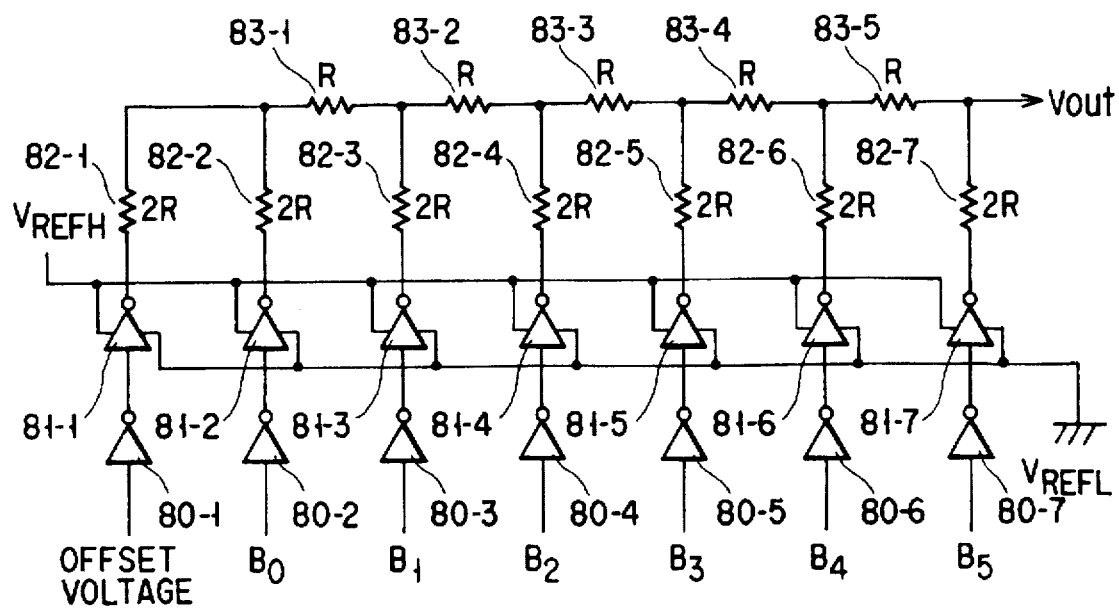
FIG. 1 is a circuit diagram showing a 6-bit R-2R ladder resistor type D/A converter, for explaining a conventional D/A converter.
Figure 2:
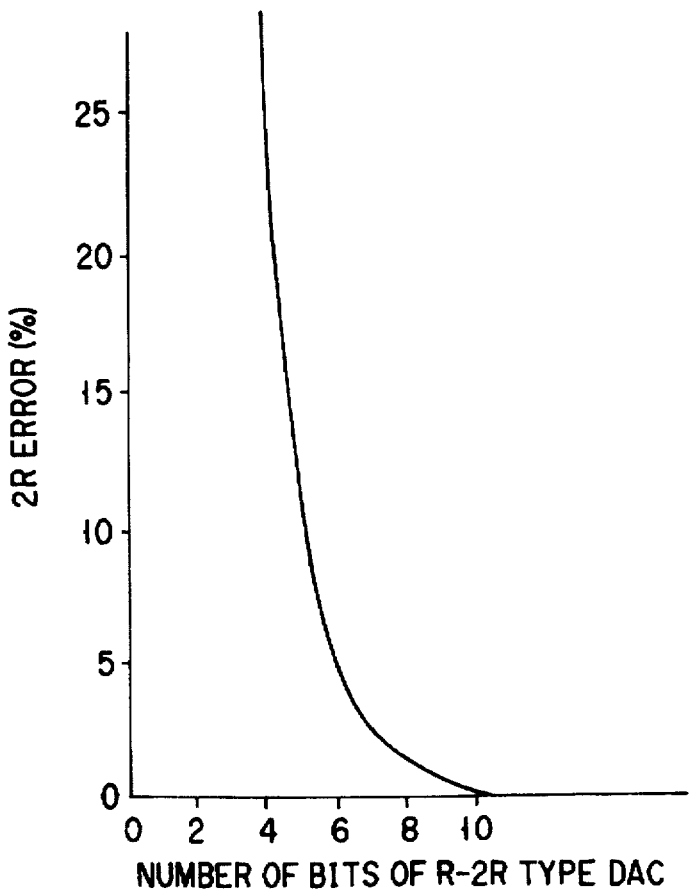
FIG. 2 is a diagram showing the relation between the number of bits of the binary code of the digital input and an error of the resistance of the resistors in a range in which the monotonously increasing property of an analog output voltage can be maintained in an R-2R ladder resistor type D/A converter.
Figure 3:
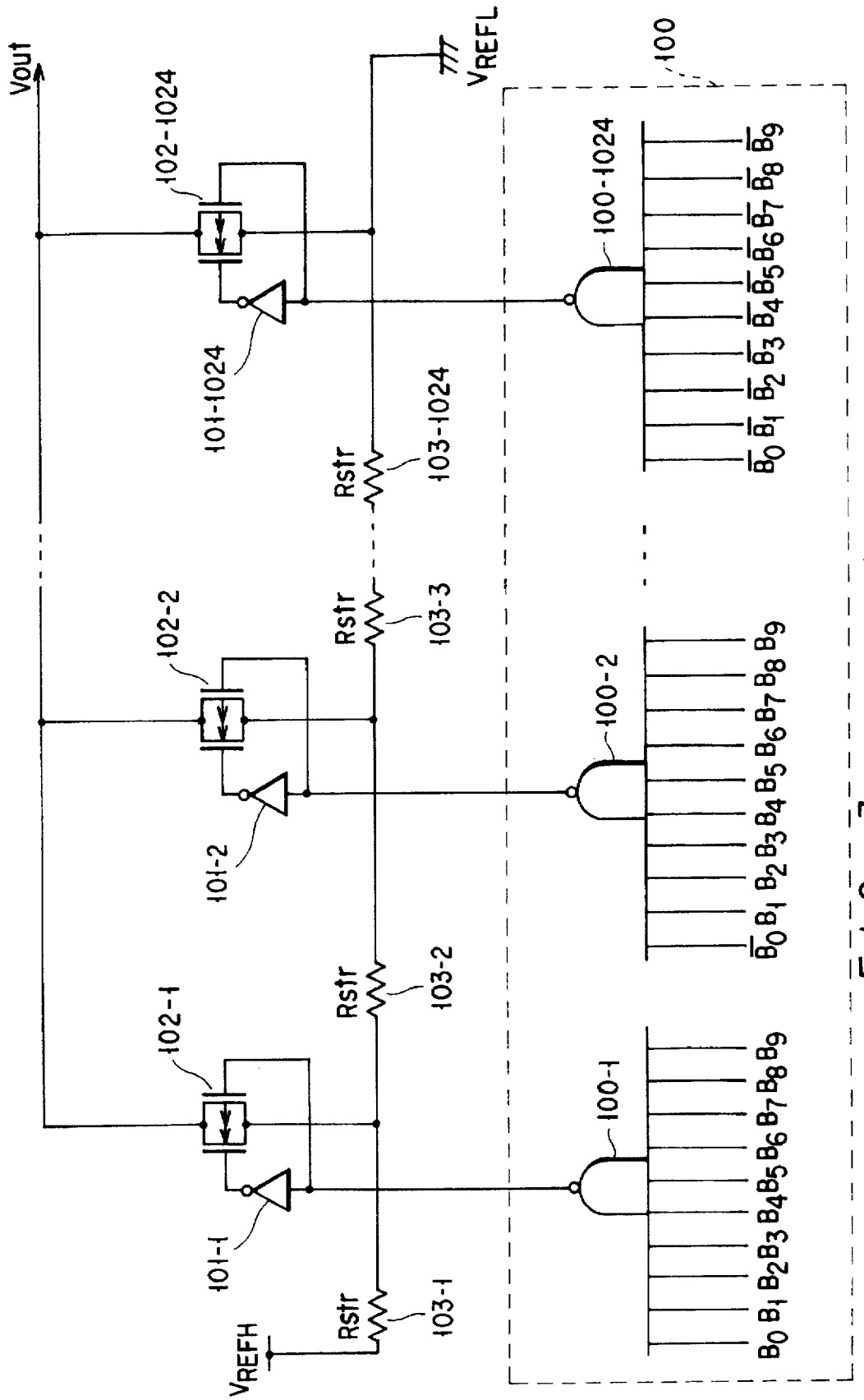
FIG. 3 is a circuit diagram showing a 10-bit string resistor type D/A converter, for explaining another conventional D/A converter.

In the composite D/A converter with the construction shown in FIGS. 4, 5A and 5B, the pattern occupancy area necessary for the R-2R ladder resistor type D/A converter circuit sections 11, 12 can be provided by the pattern occupancy area of 28 CMOS inverter circuits and the pattern occupancy area of 38 resistors with a resistance of R if the pattern areas of the CMOS inverter circuits 28 and 29 constructing each of the buffer circuits 21-1 to 21-7 and 24-1 to 24-7 are equal and the pattern area of each of the resistors 22-1 to 22-7 of resistance 2R is twice the pattern area of each of the resistors 23-1 to 23-5 of resistance R. Further, the pattern occupancy area necessary for the string resistor type D/A converter circuit section 13 can be provided by the pattern occupancy area of 96 CMOS inverter circuits and the pattern occupancy area of 16 resistors with a resistance of Rstr if the transfer gates 31-1 to 31-16 have the same pattern area as the CMOS inverter circuits 31-1 to 31-16 and the 4-input NAND gate has a pattern area of four CMOS inverters. Therefore, if the resistance R=Rstr, a 10-bit D/A converter can be realized by use of the pattern occupancy area of 124 CMOS inverter circuits and the pattern occupancy area of 54 resistors and thus the pattern occupancy area can be significantly reduced in comparison with the 10-bit string resistor type D/A converter shown in FIG. 3 which requires the pattern occupancy area of 12288 CMOS inverter circuits and the pattern occupancy area of 1024 resistors. Further, since the R-2R ladder resistor type D/A converter circuit sections 11, 12 may be formed of 6-bit D/A converter circuit sections, the favorable monotonously increasing property can be attained even if the relative errors of the resistances R and 2R are approx. 5%.

Figure 6:
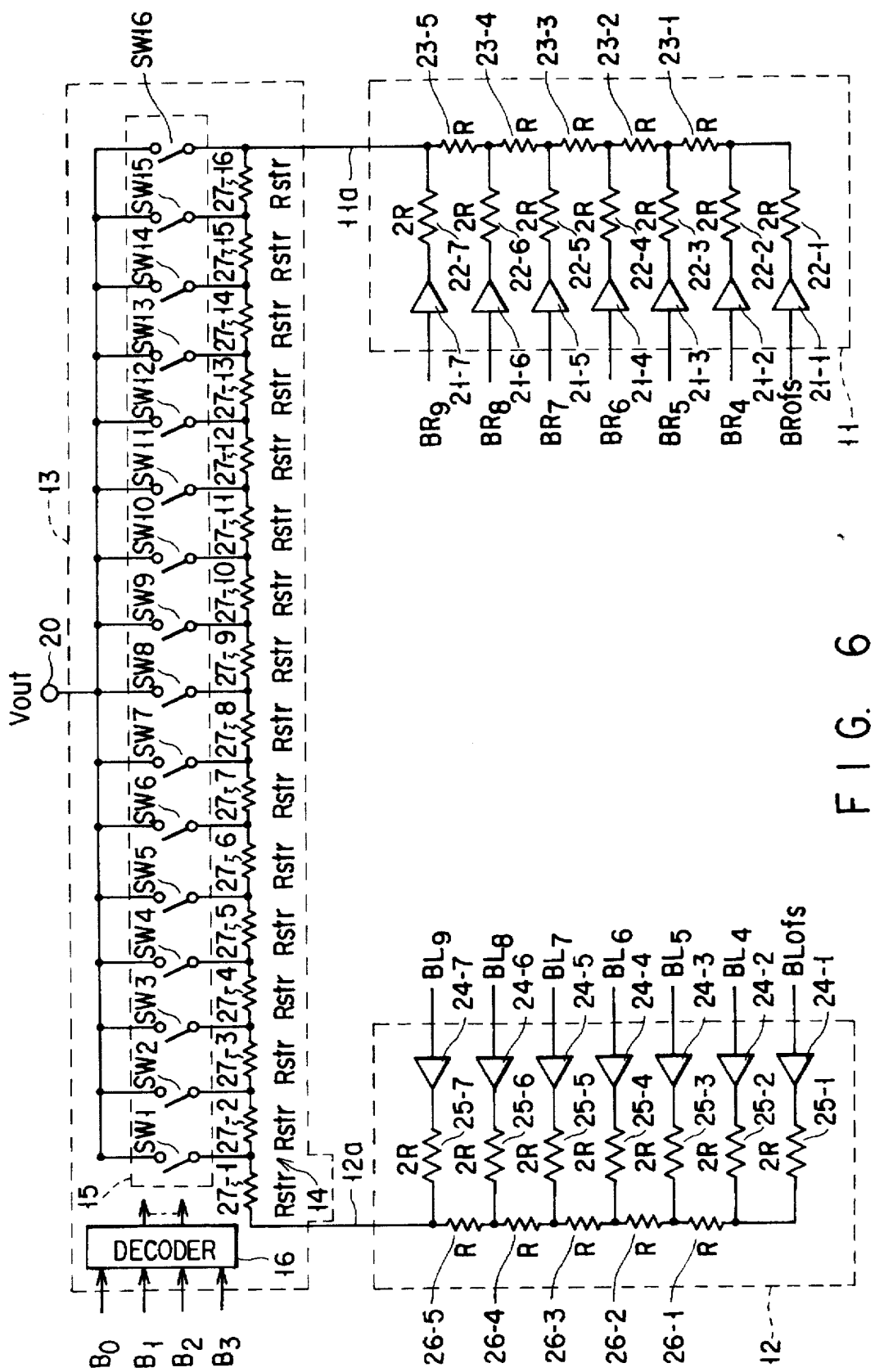
FIG. 6 is a circuit diagram showing a composite D/A converter according to a second embodiment of this invention.

FIG. 6 shows a composite D/A converter according to a second embodiment of this invention. In the first embodiment, the D/A converter circuit sections 11 and 12 are supplied with different one-bit offset voltages and the common binary code "$B_4$ to $B_9$", but in the second embodiment, the D/A converter circuit section 11 is supplied with a one-bit offset voltage BRofs and a binary code "$BR_4$ to $BR_9$" and the D/A converter circuit section 12 is supplied with a one-bit offset voltage BLofs and a binary code "$BL_4$ to $BL_9$", that is, the D/A converter circuit sections 11 and 12 are supplied with different one-bit offset voltages and different binary codes. In this case, the offset voltage BRofs has the same influence on the D/A conversion output as the least significant bit $BR_4$ of the i-bit input "$BR_4$ to $BR_9$" to the D/A converter circuit section 11 (that is, it has the same weight as the "1" level of the least significant bit), and the offset voltage BLofs has the same influence on the D/A conversion output as the least significant bit $BL_4$ of the i-bit input "$BL_4$ to $BL_9$" to the D/A converter circuit section 12 (that is, it has the same weight as the "0" level of the least significant bit).

With the above construction, only a potential difference occurring between the nodes 11a and 12a to which outputs of the D/A converter circuit sections 11 and 12 are supplied becomes different, and substantially the same operation and the same effect as those in the embodiment of FIG. 4 can be attained.

The resistances R and 2R of the resistors in the R-2R ladder resistor type D/A converter circuit sections 11, 12 may vary in some cases due to a fluctuation in the manufacturing process. In this case, if the resistances of the resistors in the D/A converter circuit sections 11, 12 vary in a similar manner, there occurs no problem, but if only one of the resistances of the resistors in the D/A converter circuit sections varies, there occurs a possibility that the resistance ratio of R-2R cannot be kept constant.

FIG. 7 shows the relation between the digital input and the analog output voltage Vout when the preset resistance ratio of R-2R in the D/A converter circuit sections 11 and 12 cannot be maintained. In FIG. 7, solid lines 12a-1 to 12a-6 show a case wherein the D/A conversion output of the second node 12a varies step by step as a voltage expressed by the i-bit binary code "$B_4$ to $B_9$" increases, and broken lines 11a-1 to 11a-6 show a case wherein the D/A conversion output of the first node 11a varies step by step as the voltage expressed by the i-bit binary code "$B_4$ to $B_9$" increases. Arrows show a case wherein the D/A conversion output Vout output from the output terminal 20 sequentially increases as a voltage expressed by the j-bit binary code "$B_0$ to $B_3$" increases. In the D/A converter shown in FIG. 4, if the D/A conversion characteristics of the D/A converter circuit sections 11 and 12 are ideal, the D/A conversion output of the first node 11a corresponding to the digital value (2a+1) of the i-bit input "$B_4$ to $B_9$" becomes equal to the D/A conversion output of the second node 12a corresponding to the digital value (2a+2) and the monotonously increasing property can be attained in the entire region of the input range. However, as shown by an arrow A in FIG. 7, if the D/A conversion output of the second node 12a corresponding to the digital value (2a+5) becomes lower than the D/A conversion output of the first node 11a corresponding to the digital value (2a+4), the monotonously increasing property cannot be maintained. Further, as shown by an arrow B, if the D/A conversion output of the second node 12a corresponding to the digital value (2a+6) becomes extremely higher than the D/A conversion output of the first node 11a corresponding to the digital value (2a+5), a voltage range in which no output can be obtained occurs.

Figure 8:
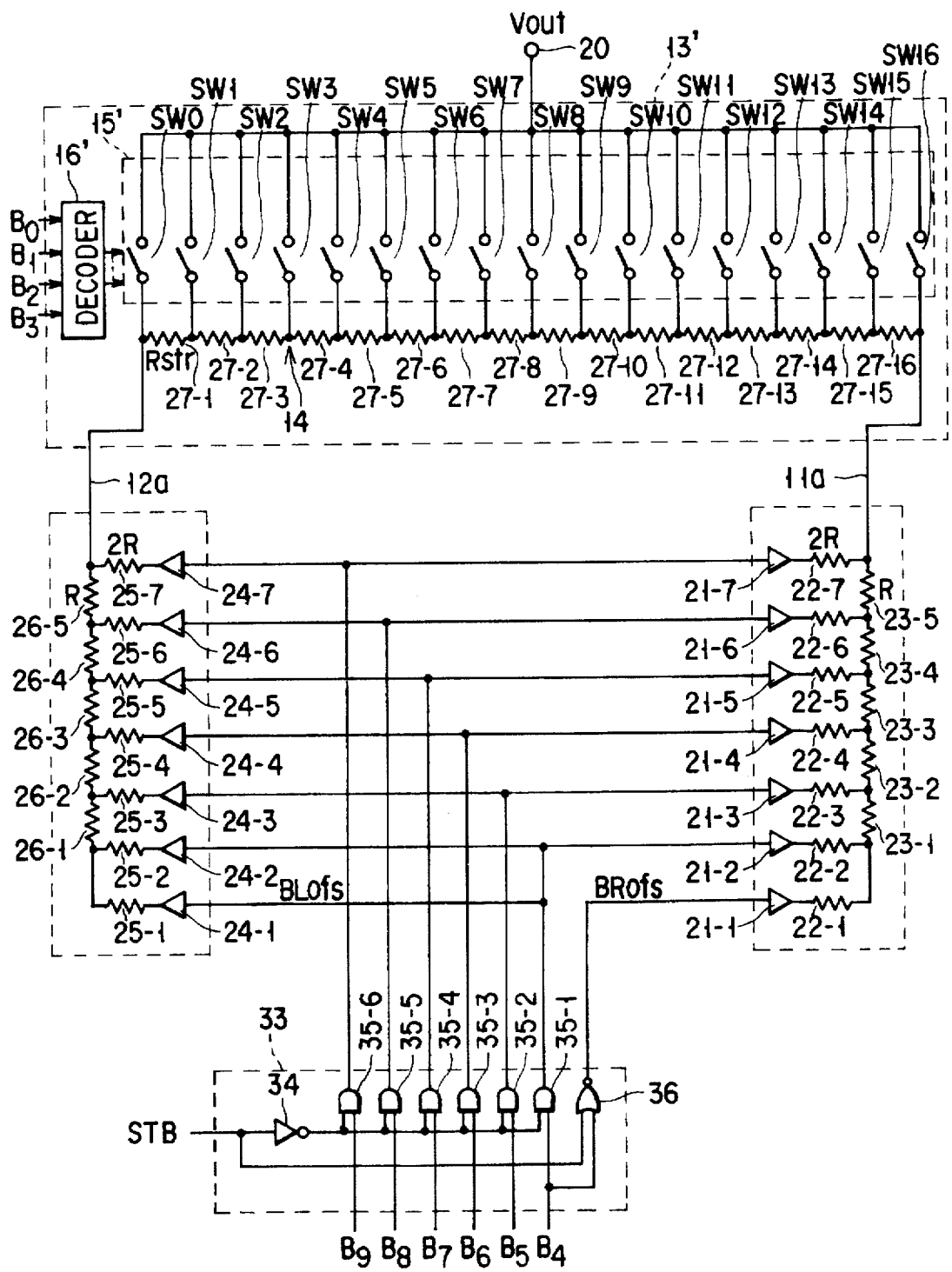
FIG. 8 is a circuit diagram showing a composite D/A converter according to a third embodiment of this invention.

FIG. 8 is a circuit diagram showing a composite D/A converter according to a third embodiment of this invention. The third embodiment is attained by improving the composite D/A converters in the first and second embodiments and is designed to attain high precision by ensuring that the monotonously increasing property can be maintained even if the resistances of the resistors of the D/A converter circuit sections 11, 12 vary and the resistance ratio of R-2R is changed and lower the power consumption in the standby mode and in a mode in which the D/A converter is not used.

The D/A converter is used to subject a binary code "$B_0$ to $B_9$" of a 10-bit digital input to the D/A conversion and includes a first D/A converter circuit section 11 of R-2R ladder resistor type, second D/A converter circuit section 12 of R-2R ladder resistor type, D/A converter circuit section 13' of string resistor type, and standby mode control circuit 33.

The D/A converter circuit sections 11, 12 are formed with the same construction as those circuits shown in FIGS. 4 and 6. The D/A converter circuit section 11 includes buffer circuits 21-1 to 21-7, resistors 22-1 to 22-7 each having a resistance of 2R, and resistors 23-1 to 23-5 each having a resistance of R. The D/A converter circuit section 12 includes buffer circuits 24-1 to 24-7, resistors 25-1 to 25-7 each having a resistance of 2R, and resistors 26-1 to 26-5 each having a resistance of R.

The standby mode control circuit 33 controls the operation to prevent a stationary current (standby current) from flowing in the D/A converter circuit section 13' of string resistor type in the standby mode and in a mode in which the D/A converter is not used. In the D/A converter shown in FIG. 8, since the digital inputs to the D/A converter circuit sections 11 and 12 of R-2R ladder resistor type in the normal operation mode are different from each other, the potential on the first node 11a and the potential on the second node 12a are always different from each other, and consequently, the stationary current flows in the D/A converter circuit section 13' of string resistor type. Therefore, an attempt is made to prevent the flow of stationary current to lower the power consumption by use of the standby mode control circuit 33. The standby mode control circuit 33 includes a CMOS inverter circuit 34, AND gates 35-1 to 35-6, and a NOR gate 36. A standby control signal is set at the "1" level in the standby mode and at the "0" level in the normal operation mode and is supplied to the input terminal of the CMOS inverter circuit 34 and one input terminal of the NOR gate 36. An output signal of the CMOS inverter circuit 34 is supplied to one-side input terminals of the AND gates 35-1 to 35-6. The other input terminals of the AND gates 35-1 to 35-6 are respectively supplied with binary code bits $B_4$ to $B_9$. Further, the other input terminal of the NOR gate 36 is supplied with the binary code bit $B_4$. An output of the NOR gate 36 is supplied to the buffer circuit 21-1 of the D/A converter circuit section 11 as an offset voltage BRofs. An output of the AND gate 35-1 is supplied to the buffer circuit 21-2 of the D/A converter circuit section 11 and the buffer circuits 24-1, 24-2 of the D/A converter circuit section 12. The output of the AND gate 35-1 supplied to the buffer circuit 24-1 is used as the offset voltage BRofs. An output of the AND gate 35-2 is supplied to the buffer circuits 21-3, 24-3 of the D/A converter circuit sections 11, 12. An output of the AND gate 35-3 is supplied to the buffer circuits 21-4, 24-4 of the D/A converter circuit sections 11, 12, and an output of the AND gate 35-4 is supplied to the buffer circuits 21-5, 24-5 of the D/A converter circuit sections 11, 12. Further, an output of the AND gate 35-5 is supplied to the buffer circuits 21-6, 24-6 of the D/A converter circuit sections 11, 12, and an output of the AND gate 35-6 is supplied to the buffer circuits 21-7, 24-7 of the D/A converter circuit sections 11, 12.

With the above construction, the offset voltage BRofs and binary code input to the first D/A converter circuit section 11 are all set to the "0" level when the standby mode control signal STB is set at the "1" level (standby mode). Likewise, the offset voltage BLofs and binary code input to the second D/A converter circuit section 12 are all set to the "0" level. As a result, the voltage on the first node 11a and the voltage on the second node 12a become equal to each other so as to prevent the stationary current from flowing in the D/A converter circuit section 13 of string resistor type.

On the other hand, when the standby mode control signal STB is set at the "0" level (in the normal operation mode), an inversion signal of the binary code bit $B_4$ is input as the offset voltage BRofs to the buffer circuit 21-1 of the D/A converter circuit section 11 and the binary code bits $B_4$ to $B_9$ are respectively input to the buffer circuits 21-2 to 21-7. Further, the binary code bit $B_4$ is input as the offset voltage BLofs to the buffer circuit 24-1 of the D/A converter circuit section 12 and the binary code bits $B_4$ to $B_9$ are respectively input to the buffer circuits 24-2 to 24-7.

The D/A converter circuit section 13' has a function of subjecting the binary code bits $B_0$ to $B_3$ of the remaining lower four bits among the binary code bits $B_0$ to $B_9$ of the digital input to the D/A conversion. The D/A converter circuit section 13' includes a resistor string 14, selection circuit 15', and decoder circuit 16'. The resistor string 14 is a series circuit of 16 resistors 27-1 to 27-16 with a resistance of Rstr connected between the first node 11a and the second node 12a. The selection circuit 15' selectively derives a voltage from the second node 12a, the voltage dividing nodes of the resistor string 14 and the first node 11a and includes ($2^j$+1) switching circuits SW0 to SW16 which are connected at one end to the respective nodes and commonly connected at the other ends to the output terminal 20. The ON/OFF states of the switching circuits SW1 to SW16 are selectively controlled by signals obtained by decoding the j-bit binary code "$B_0$ to $B_3$" in the decoder circuit 16'. As described before, the decoder circuit 16' is constructed to create a decode signal used for switching a node which is one of the first and second nodes 11a and 12a and set on the voltage reference side in response to inversion of the magnitude relation between the D/A conversion output of the first node 11a and the D/A conversion output of the second node 12a according to "0" or "1" of the least significant bit $B_4$ of the i-bit input. That is, a voltage which is one of the voltages determined by equally dividing the potential difference between the first and second nodes 11a and 12a whose voltage levels are determined according to the i-bit binary code "$B_4$ to $B_9$" and the offset voltage BRofs, BLofs by 2j according to the j-bit binary code "$B_0$ to $B_3$" and the voltage on the second node 12a and which is a voltage on one of the nodes corresponding to the j-bit binary code is selected and output from the output terminal 20. As a result, an analog voltage Vout which is one of the voltages determined by equally dividing the potential difference between the offset voltages BRofs and BLofs supplied to the D/A converter circuit sections 11 and 12 by $2^n$ and the voltage on the second node 12a and which is a voltage corresponding to the binary code "$B_0$ to $B_9$" is output.

Figure 9:
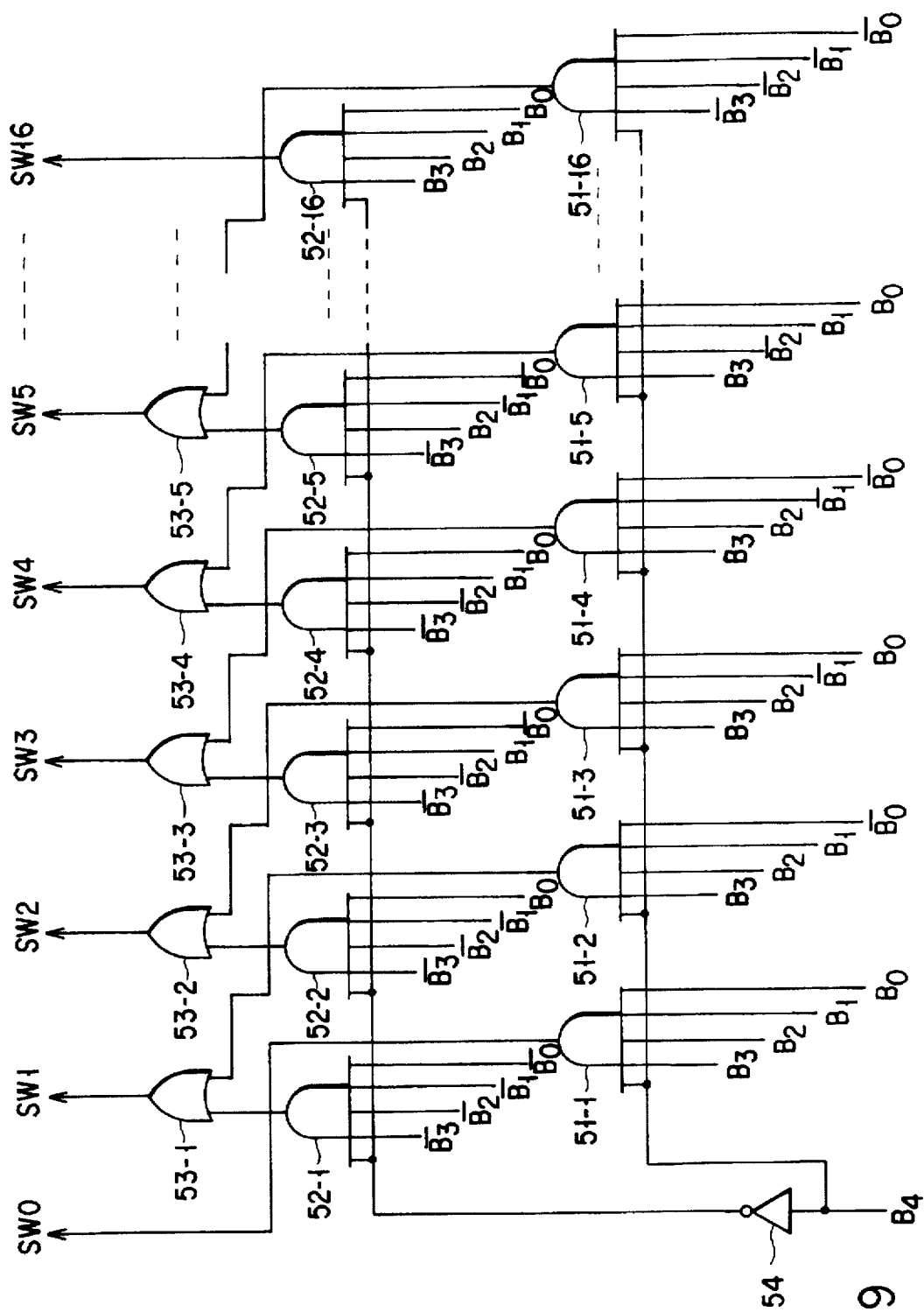
FIG. 9 is a circuit diagram showing an example of the construction of a decoder circuit in the circuit of FIG. 8.

FIG. 9 shows an example of the construction of the decoder circuit 16' in the circuit of FIG. 8. The decoder circuit 16' includes 5-input AND gates 51-1 to 51-16, 52-1 to 52-16, 2-input OR gates 53-1 to 53-16 and inverter circuit 54. The AND gates 51-1 to 51-16 construct a first decoder section and the AND gates 52-1 to 52-16 construct a second decoder section, and when one of the decoder sections is activated, the other decoder section is deactivated. The results of decoding by the first and second decoding sections are supplied to the switching circuits SW1 to SW16 via the OR gates 53-1 to 53-16. In this case, the switching circuit SW0 is supplied with an output of the AND gate 51-1 and the switching circuit SW16 is supplied with an output of the AND gate 52-16. The binary code $B_4$ is supplied to the inverter circuit 54 and the first input terminals of the AND gates 51-1 to 51-16. An inversion signal of the binary code $B_4$ inverted by the inverter circuit 54 is supplied to the first input terminals of the AND gates 52-1 to 52-16. The second to fifth input terminals of each of the AND gates 51-1 to 51-16, 52-1 to 52-16 are selectively supplied with binary code bits $B_0$ to $B_3$ and inversion signals $\overline{B_0}$ to $\overline{B_3}$ thereof. In this case, binary code bits input to each of the AND gates 52-1 to 52-16 are set in inverted form of binary code bits input to a corresponding one of the AND gates 51-1 to 51-16. That is, for example, the AND gate 51-1 is supplied with binary code bits $B_0$ to $B_3$ and the corresponding AND gate 52-1 is supplied with binary code bits $\overline{B_0}$ to $\overline{B_3}$. Likewise, the AND gate 51-2 is supplied with binary code bits $\overline{B_0}$, $B_1$ to $B_3$ and the corresponding AND gate 52-2 is supplied with binary code bits $B_0$, $\overline{B_1}$ to $\overline{B_3}$. Binary code bits in the same relation as described above are selectively supplied to the AND gates 51-3 to 51-16 and the AND gates 52-3 to 52-16.

An output of the AND gate 51-1 is input to the switching circuit SW0 to control the ON/OFF state of the switching circuit SW0. The OR gate 53-1 is supplied with output signals of the AND gates 51-2 and 52-1 and the logical OR output of the OR gate 53-1 is supplied to the switching circuit SW1. Likewise, the OR gates 53-2 to 53-16 are respectively supplied with output signals of the AND gates 51-3 to 51-16 and 52-2 to 52-15 and the logical OR outputs of the OR gates 53-2 to 53-16 are respectively supplied to the switching circuits SW2 to SW15. An output signal of the AND gate 52-16 is supplied to the switching circuit SW16 to control the ON/OFF state thereof.

With the above construction, when the binary code bit $B_4$ is "0", the first decoding section is deactivated, that is, all of the outputs of the AND gates 51-1 to 51-16 are set to the "0" level. At this time, the second decoder section is activated and the operation of decoding a combination of $B_0$ to $B_3$ and $\overline{B_0}$ to $\overline{B_3}$ is effected. On the other hand, when the binary code bit $B_4$ is "1", the first decoding section is activated and the operation of decoding a combination of $B_0$ to $B_3$ and $\overline{B_0}$ to $\overline{B_3}$ is effected. At this time, the second decoder section is deactivated and all of the outputs of the AND gates 52-1 to 52-16 are set to the "0" level.

In this case, if the node from which a voltage is derived in the resistor string 14 of the D/A converter circuit section 13 according to the decoder output is set in position having a preset number which is determined by allotting sequential numbers to the nodes starting from the second node 12a, the decoding operation is effected to set the node in position having a preset number which is determined by allotting sequential numbers to the nodes starting from the first node 11a when the binary code bit $B_4$ is "1". That is, if the input (the lower j-bit binary code "$B_0$ to $B_3$) of the decoder circuit 16' of the D/A converter circuit section 13 is set in a constant state, a D/A conversion voltage Vout which is higher than the voltage of the second node 12a is output when the binary code bit $B_4$ of the lowest order is "0", and a D/A conversion voltage Vout which is higher than the voltage of the first node 11a is output when the binary code bit $B_4$ is "1".

As described above, the offset voltage BRofs input to the first D/A converter circuit section 11 becomes an inversion signal of the least significant bit $B_4$ in the binary code "$B_4$ to $B_9$" of the i-bit input. Further the offset voltage BLofs input to the second D/A converter circuit section 12 becomes the same signal as the least significant bit $B_4$ in the binary code "$B_4$ to $B_9$" of the i-bit input. As a result, the relation between the amplitude of the voltage of the ladder resistor type D/A converter circuit sections 11, 12 expressed by the binary code "$B_4$ to $B_9$" and the D/A conversion output is obtained as shown in FIG. 10, for example. That is, the D/A conversion output of the first node 11a in the first D/A converter circuit section 11 has the same value when the least significant bit $B_4$ is "0" and when it is "1". Further, the D/A conversion output of the second node 12a in the second D/A converter circuit section 12 becomes lower than the D/A conversion output of the first node 11a when the least significant bit $B_4$ of the i-bit input is "0" and it becomes higher than the D/A conversion output of the first node 11a when the least significant bit $B_4$ is "1". That is, the voltage of the first node 11a and the voltage of the second node 12a are always different and the magnitude relation between the D/A conversion output of the first node 11a and the D/A conversion output of the second node 12a may be inverted according to "0" or "1" of the least significant bit $B_4$ of the binary code of the i-bit input. As a result, even if the resistances R and 2R of the resistors in the R-2R ladder resistor type D/A converter circuit sections 11 and 12 vary due to a fluctuation in the manufacturing process and the resistance ration of R-2R cannot be maintained, the D/A conversion output of the first node 11a and the D/A conversion output of the second node 12a can be made equal to each other and the monotonously increasing property can be attained in the entire region of the input range.

In the third embodiment, the standby mode control circuit 33 is so constructed that the binary code and offset voltage BRofs input to the first D/A converter circuit section 11 and the binary code and offset voltage BLofs input to the second D/A converter circuit section 12 are all set to "0" when the standby mode control signal STB is "1" (standby mode), but it is also possible to modify the circuit construction of the standby mode control circuit 33 so that the binary codes and offset voltages BRofs, BLofs input to the first and second D/A converter circuit sections 11 and 12 are all set to "1" when the standby mode control signal STB is "1", and in this case, it is possible to prevent the stationary current from flowing in the string resistor 14 of the D/A converter circuit section 13, thereby making it possible to lower the power consumption.

Further, when the leapfrog control as explained in the third embodiment is effected, the relation between the offset voltage BRofs and the binary code input $B_4$ input to the least significant bit position of the first D/A converter circuit section 11 is satisfied if they are set in the inverted relation, and therefore, the D/A converter can be constructed as shown in FIGS. 11 to 13.

FIGS. 11 to 13 are circuit diagrams showing composite D/A converters according to fourth to sixth embodiments of this invention in which the method of applying the binary code input $B_4$ and offset voltage BRofs to the D/A converter circuit section 11 in the circuit of FIG. 8 is changed.

In the composite D/A converter shown in FIG. 11, an output signal of an AND gate 35-1 is supplied to buffer circuits 21-1, 24-1, 24-2 and an output signal of a NOR gate 35 is supplied to a buffer circuit 21-2. Like the case of FIG. 8, the other binary code bits $B_5$ to $B_9$ are supplied from AND gates 35-2 to 35-6 to D/A converter circuit sections 11, 12. With this construction, "0" is given as the offset voltage BRofs when the binary code bit $B_4$ which is the least significant bit of the i-bit digital input is "0", and "1" is given as the offset voltage BRofs when the binary code bit $B_4$ is "1".

In the circuit shown in FIG. 12, a signal input to a buffer circuit 21-1 to be supplied with a binary code bit $B_4$ is set at "1" and the offset voltage BRofs is set at "0" irrespective of whether the binary code bit $B_4$ which is the least significant bit of the i-bit digital input is "1" or "0", and the input terminal of the buffer circuit 21-1 is fixed at the ground potential Vss (0 V) and the input terminal of a buffer circuit 21-2 is fixed at the power source potential Vcc (5 V). In the circuit shown in FIG. 13, a signal input to a buffer circuit 21-2 to be supplied with a binary code bit $B_4$ is set at "0" and the offset voltage BRofs is set at "1" irrespective of whether the binary code bit $B_4$ which is the least significant bit of the i-bit digital input is "1" or "0", and the input terminal of a buffer circuit 21-1 is fixed at the power source potential Vcc and the input terminal of the buffer circuit 21-2 is fixed at the ground potential Vss. That is, in the circuits of FIGS. 12 and 13, "0" or "1" is input as the offset voltage BRofs to the D/A converter circuit section 11 irrespective of whether the binary code bit $B_4$ which is the least significant bit of the i-bit digital input is "1" or "0".

With the above construction, the same operation and the same effect as those in the circuit of FIG. 8 can be attained.

Figure 14:
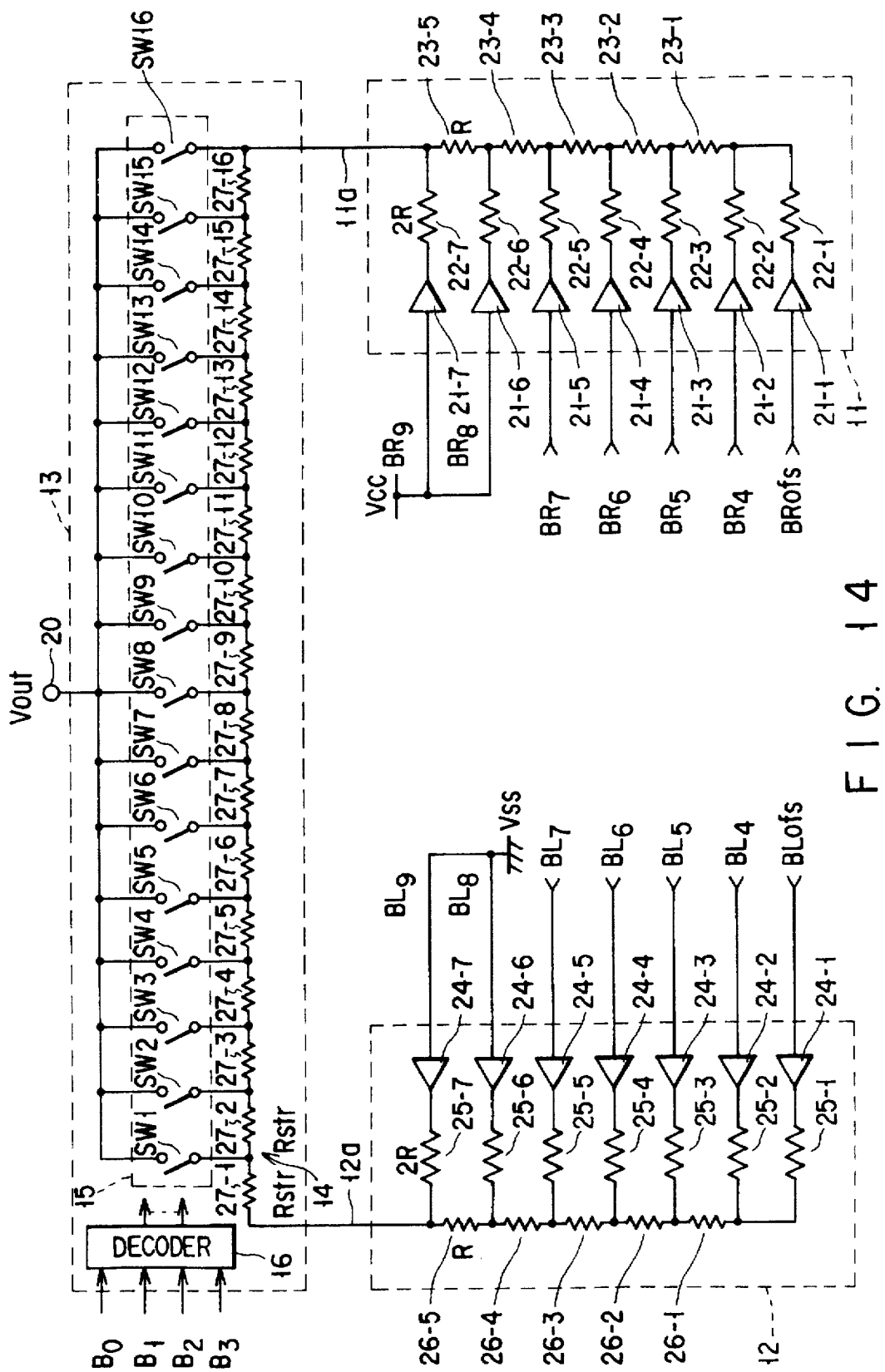
FIG. 14 is a circuit diagram showing a composite D/A converter according to a seventh embodiment of this invention.

FIG. 14 is a circuit diagram showing a composite D/A converter according to a seventh embodiment of this invention. The D/A converter shown in FIG. 14 is different from the D/A converters in the first and second embodiments in the way of supplying a binary code and offset voltage to the D/A converter circuit sections 11, 12, but the other construction is the same.

That is, for example, the upper two bits $BR_8$ and $BR_9$ of a binary code "$BR_4$ to $BR_9$" input to the first D/A converter circuit section 11 are fixed at "1" (connected to the power source Vcc) and the remaining bits $BR_4$ to $BR_7$ of the binary code and the offset voltage BRofs are freely supplied. Likewise, for example, the upper two bits $BL_8$ and $BL_9$ of a binary code "$BL_4$ to $BL_9$" input to the second D/A converter circuit section 12 of ladder resistor type are fixed at "0" (connected to the ground potential Vss) and the remaining bits $BL_4$ to $BL_7$ of the binary code and the offset voltage BLofs are freely supplied.

Thus, by independently controlling the inputs of binary codes to the two ladder resistor type D/A converter circuit sections 11, 12 for each of the ladder resistor type D/A converter circuit sections, a potential difference (voltage range in which the string resistor type D/A converter circuit section 13 can output) between the first node 11a and the second node 12a can be freely determined. As a result, the rate of the variation range of the D/A conversion output of the D/A converter circuit section 13 in the entire variation range of the D/A conversion output of the D/A converter becomes relatively large and conversion precision can be expected to be further improved. Therefore, the construction shown in FIG. 14 is effective when the voltage range in which the string resistor type D/A converter circuit section 13 can produce an output is previously known or when an output outside the known voltage range is inhibited.

Figure 15:
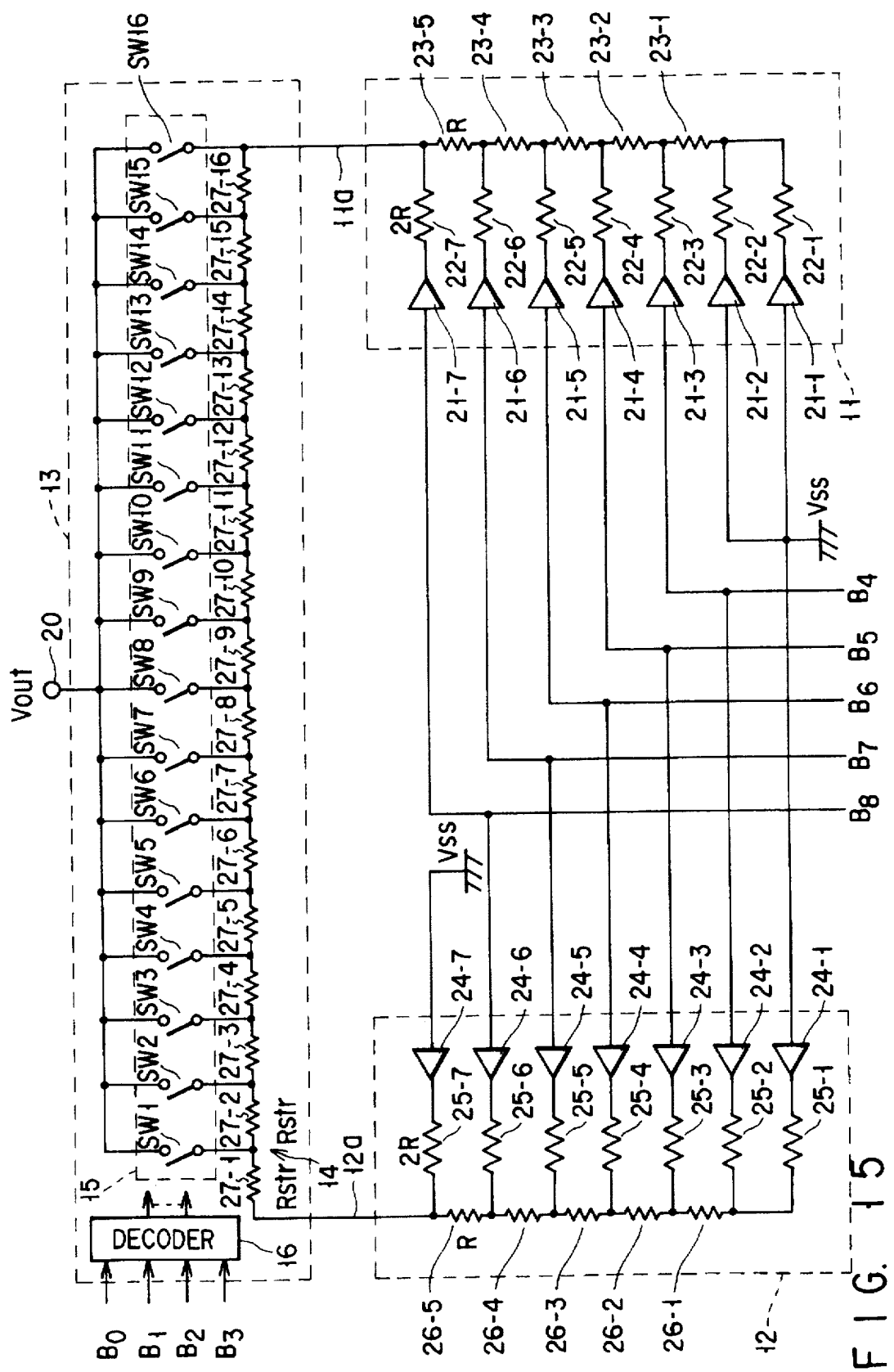
FIG. 15 is a circuit diagram showing a composite D/A converter according to an eighth embodiment of this invention.

FIG. 15 is a circuit diagram showing a composite D/A converter according to an eighth embodiment of this invention. The D/A converter shown in FIG. 15 is different from the D/A converter in the first embodiment in the way of supplying a binary code and offset voltage to the two ladder resistor type D/A converter circuit sections 11, 12, and the amplitude of an input to the D/A converter circuit section 11 is set to twice the amplitude of an input to the second D/A converter circuit section 12, for example. The other construction is the same as that of FIGS. 4 and 6.

That is, the input terminals of buffer circuits 21-1, 21-2 of the first D/A converter circuit section 11 are connected to the ground potential Vss and binary code bits $B_4$ to $B_8$ are input to buffer circuits 21-3 to 21-7. Further, the binary code bits $B_4$ to $B_8$ are input to buffer circuits 24-2 to 24-6 of the second D/A converter circuits section 12 and the input terminal of the buffer circuits 24-1 and 24-7 are connected to the ground potential Vss. With the above connection, the binary code bits $B_4$ to $B_8$ are supplied as an input to the upper 5 bit positions of the first D/A converter circuit section 11 and an input to the least significant bit position and the offset voltage BRofs are fixed at "0". On the other hand, an input to the most significant bit position of the second D/A converter circuit section 12 is fixed at "0", the binary code bits $B_4$ to $B_8$ are supplied as an input to the remaining 5 bit positions other than the most significant bit position, and the offset voltage BLofs is fixed at "0".

By thus supplying the binary code bits and offset voltages to the two ladder resistor type D/A converter circuit sections 11, 12 with the input bit positions shifted, the voltage of the first node 11a becomes twice the voltage of the second node 12a and the potential difference between the voltage of the first node 11a and the voltage of the second node 12a becomes larger as the 5-bit binary code "$B_4$ to $B_8$" becomes larger. In other words, it is possible for the relation between the magnitude of the binary code "$B_4$ to $B_8$" and the D/A conversion output Vout to have the multiplication characteristic (a value obtained by multiple the voltage expressed by the binary code "$B_4$ to $B_8$" is output as the D/A conversion output Vout). Thus, D/A converter can be applied when a device which is controlled by the D/A conversion output Vout is required to have the multiplication characteristic.

FIG. 16 is a circuit diagram of a composite D/A converter according to the ninth embodiment of the present invention. This D/A converter differs from the eighth embodiment in that the magnitudes of the binary code and offset signal which are input to the D/A converter circuit sections 11 and 12. More precisely, the code and signal input to the first D/A converter circuit section 11 have magnitudes which are squares of the magnitudes of the code and signal input to the second D/A converter circuit section 12. The D/A converter shown in FIG. 16 is similar in basic structure to those illustrated in FIGS. 4, 6 and 8.

Of the buffer circuits incorporated in the first D/A converter circuit section 11, the buffer circuits 21-1, 21-2, 21-5 and 21-7 have their input terminals connected to the ground potential Vss, and the buffer circuits 21-3, 21-4 and 21-6 are connected to receive binary codes $B_4$, $B_5$ and $B_6$, respectively. Similarly, of the buffer circuits incorporated in the second D/A converter circuit section 12, the buffer circuits 24-1, 24-5, 24-6 and 24-7 have their input terminals connected to the ground potential Vss, and the buffer circuits 24-2, 21-3 and 21-4 are connected to receive binary codes $B_4$, $B_5$ and $B_6$, respectively. Since the binary codes $B_4$, $B_5$ and $B_6$ are supplied to both D/A converter circuit sections 11 and 12, the voltage at the first node 11a is square of the voltage at the second node 12a.

Further, in order to set up a relation other than a linear relation between the amplitude of the input voltage expressed by the binary code and the D/A conversion output Vout, it is possible to supply the binary codes and offset voltages to the two ladder resistor type D/A converter circuit sections 11, 12 with the input bit positions shifted as explained in the eighth and ninth embodiments or change the resistances of the resistors 26-1 to 26-16 in the segment resistor type D/A converter circuit section 13.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A digital-to-analog converter comprising:
    a first D/A converter circuit section of i-bit ladder resistor type for receiving a binary code of upper i bits of an n-bit (i<n) digital input and a first offset voltage of one bit having a weight of the least significant bit of the i-bit binary code and effecting the D/A conversion to output a first analog voltage to a first node;
    a second D/A converter circuit section of i-bit ladder resistor type for receiving the binary code of upper i bits of the n-bit digital input and a second offset voltage of one bit having a weight of the least significant bit of the i-bit binary code and effecting the D/A conversion to output a second analog voltage which is different from the first analog voltage to a second node; and a third D/A converter circuit section of j-bit (j<n, j=n−i, i, j≧1) string resistor type connected between the first and second nodes of said first and second D/A converter circuit sections, for subjecting a binary code of the remaining lower j bits of the n-bit digital input to the D/A conversion process to output an analog voltage corresponding to the n-bit digital input.

2. The digital-to-analog converter according to claim 1, wherein said first D/A converter circuit section includes first buffer circuits of (i+1) supplied with the first offset voltage and the upper i-bit binary code, and a first R-2R ladder resistor network supplied with outputs of said first buffer circuits, for outputting a first analog voltage corresponding to the upper i-bit binary code from the first node, and said second D/A converter circuit section includes second buffer circuits of (i+1) supplied with the second offset voltage and the upper i-bit binary code, and a second R-2R ladder resistor network supplied with outputs of said second buffer circuits, for outputting a second analog voltage corresponding to the upper i-bit binary code from the second node.

3. The digital-to-analog converter according to claim 2, wherein each of said first and second buffer circuits includes a first CMOS inverter circuit supplied with a binary code bit at an input terminal thereof, and a second CMOS inverter circuit whose input terminal is connected to the output terminal of said first CMOS inverter circuit and whose output terminal is connected to one end of one of resistors having a resistance of 2R and provided in said first and second ladder resistor networks, said first CMOS inverter circuit is operated on a power source voltage and a ground potential and said second CMOS inverter circuit is operated on a voltage between the upper and lower limits of the first and second analog voltages on the first and second nodes used as a power source voltage.

4. The digital-to-analog converter according to claim 1, wherein said third D/A converter circuit section includes a resistor string having $2^j$ resistors of the same resistance serially connected between the first and second nodes, and a selection circuit for selectively deriving a voltage of the first node, voltages of connection nodes between the respective resistors of said resistor string, and a voltage of the second node.

5. The digital-to-analog converter according to claim 4, wherein said third D/A converter circuit section further includes a decoder circuit for decoding the lower j-bit binary code and controlling said selection circuit.

6. The digital-to-analog converter according to claim 5, wherein said selection circuit includes switching circuits having one-side ends respectively connected to the first node, the connection nodes between the respective resistors of said resistor string, and the second node and the other ends commonly connected to the output terminal of the analog voltage, and said decoder circuit includes j-input NAND gates respectively provided for said switching circuits and selectively supplied with the lower j-bit binary code and the inversion signal thereof.

7. The digital-to-analog converter according to claim 1, wherein the first offset voltage supplied to said first D/A converter circuit section is fixed at a first voltage and the second offset voltage supplied to said second D/A converter circuit section is fixed at a second voltage which is different from the first voltage.

8. The digital-to-analog converter according to claim 1, wherein signals in the inverted relation are input as the first offset voltage and the least significant bit of the binary code to said first D/A converter circuit section, the same signal is input as the second offset voltage and the least significant bit of the binary code to said second D/A converter circuit section, and said third D/A converter circuit section outputs an analog voltage while switching a node which is one of the first and second nodes 11a and 12a and set on the voltage reference side in response to inversion of the magnitude relation between the first analog voltage of the first node and the second analog voltage of the second node according to "0" or "1" of the least significant bit of the i-bit binary code.

9. The digital-to-analog converter according to claim 8, wherein "1" or "0" is input as the offset voltage of said first D/A converter circuit section when the least significant bit of the i-bit input is "0" or "1", respectively.

10. The digital-to-analog converter according to claim 8, wherein one of "1" and "0" is input as the offset voltage of said first D/A converter circuit section irrespective of whether the least significant bit of the i-bit input is "0" or "1"

11. The digital-to-analog converter according to claim 1, wherein at least upper one bit of the binary code input to said first D/A converter circuit section is fixed at "1", the remaining bits thereof and the first offset voltage are freely applied, at least upper one bit of the binary code input to said second D/A converter circuit section is fixed at "0", and the remaining bits thereof and the second offset voltage are freely applied.

12. The digital-to-analog converter according to claim 1, wherein the magnitude of the digital input to said first D/A converter circuit section is set to be an integral multiple of the magnitude of the digital input to said second D/A converter circuit section.

13. The digital-to-analog converter according to claim 1, further comprising a standby mode control circuit for setting the potential of the first node of said first D/A converter circuit section equal to the potential of the second node of said second D/A converter circuit section in the standby mode.

14. The digital-to-analog converter according to claim 13, wherein said standby mode control circuit supplies the upper i-bit binary code in the normal operation mode and "0" in the standby mode as the digital inputs to said first and second D/A converter circuit sections.

15. The digital-to-analog converter according to claim 13, wherein said standby mode control circuit supplies the upper i-bit binary code in the normal operation mode and "1" in the standby mode as the digital inputs to said first and second D/A converter circuit sections.

16. The digital-to-analog converter according to claim 13, wherein said standby mode control circuit includes a 2-input NOR gate supplied with a standby mode control signal which is set in the active state in the standby mode and non-active state in the normal operation mode and the least significant bit of the i-bit binary code, for supplying a logical output as the first offset voltage to said first D/A converter circuit section, a first AND gate supplied with an inversion signal of the standby mode control signal and the least significant bit of the i-bit binary code, for supplying a logical output as the second offset voltage and the least significant bit of the i-bit binary code to said second D/A converter circuit section, and second AND gates of (i−1) supplied with the inversion signal of the standby mode control signal and binary code bits other than the least significant bit of the i-bit binary code, for supplying outputs as inputs other than the least significant bit of the binary code to said first and second D/A converter circuit sections.

17. A digital-to-analog converter comprising:
first D/A converting means of i-bit ladder resistor type for receiving a binary code of upper i bits of an n-bit (i<n) digital input and a first offset voltage of one bit having a weight of the least significant bit of the i-bit binary code and effecting the D/A conversion to output a first analog voltage to a first node;

second D/A converting means of i-bit ladder resistor type for receiving the binary code of upper i bits of the n-bit digital input and a second offset voltage of one bit having a weight of the least significant bit of the i-bit binary code and effecting the D/A conversion to output a second analog voltage which is different from the first analog voltage to a second node; and third D/A converting means of j-bit (j<n, j=n-i, i, j≧1) string resistor type connected between the first and second nodes of said first and second D/A converting means, for subjecting a binary code of the remaining lower j bits of the n-bit digital input to the D/A conversion process to output an analog voltage corresponding to the n-bit digital input.

18. The digital-to-analog converter according to claim 17, further comprising standby mode control means for setting the potential of the first node of said first D/A converting means equal to the potential of the second node of said second D/A converting means in the standby mode.

19. A digital-to-analog conversion method for a digital-to-analog converter having a first D/A converter circuit section of ladder resistor type, a second D/A converter circuit section of ladder resistor type, and a third D/A converter circuit section of string resistor type connected between a first node of the first D/A converter circuit section and a second node of the second D/A converter circuit section, comprising the steps of:

supplying an upper i-bit binary code of an n-bit (i<n) digital input and a first offset voltage of one bit having the weight of the least significant bit of the i-bit binary code to the first D/A converter circuit section and supplying the upper i-bit binary code of the n-bit digital input and a second offset voltage of one bit having the weight of the least significant bit of the i-bit binary code to the second D/A converter circuit section;

causing the first D/A converter circuit section to effect the D/A conversion to output a first analog voltage to the first node and causing the second D/A converter circuit section to effect the D/A conversion to output a second analog voltage to the second node;

supplying the remaining lower j-bit (j<n, j=n-i, i, j≧1) binary code of the n-bit digital input to the third D/A converter circuit section; and causing the third D/A converter circuit section to effect the D/A conversion to output an analog voltage corresponding to the n-bit digital input.

20. A one-chip microcomputer comprising:

a signal processing section for processing digital data; and a digital-to-analog converter for converting digital data processing in said signal processing section into corresponding analog data;

wherein said digital-to-analog converter includes:

a first D/A converter circuit section of i-bit ladder resistor type for receiving a binary code of upper i bits of an n-bit (i<n) digital input and a first offset voltage of one bit having a weight of the least significant bit of the i-bit binary code and effecting the D/A conversion to output a first analog voltage to a first node;

a second D/A converter circuit section of i-bit ladder resistor type for receiving the binary code of upper i bits of the n-bit digital input and a second offset voltage of one bit having a weight of the least significant bit of the i-bit binary code and effecting the D/A conversion to output a second analog voltage which is different from the first analog voltage to a second node; and a third D/A converter circuit section of j-bit (j<n, j=n-i, i, j≧1) string resistor type connected between the first and second nodes of said first and second D/A converter circuit sections, for subjecting a binary code of the remaining lower j bits of the n-bit digital input to the D/A conversion process to output an analog voltage corresponding to the n-bit digital input.

21. The microcomputer according to claim 20, further comprising a standby mode control circuit for setting the potential of the first node of said first D/A converter circuit section equal to the potential of the second node of said second D/A converter circuit section in the standby mode.

* * * * *